United States Patent [19]

Chang

[11] Patent Number: 5,712,871
[45] Date of Patent: Jan. 27, 1998

[54] METHOD AND APPARATUS FOR IMPLEMENTING A DIRECT-SEQUENCE CODE DIVISION MULTIPLE ACCESS COMMUNICATION SYSTEM WITH AN M-ARY PULSE-POSITION MODULATED SPREADING-SEQUENCE SIGNAL

[76] Inventor: Chen-Yi Chang, 1001 Ta Hsueh Road, Hsinchu, Taiwan

[21] Appl. No.: 498,744

[22] Filed: Jul. 6, 1995

Related U.S. Application Data

[63] Continuation-in-part of Ser. No. 077,347, Jun. 14, 1993, Pat. No. 5,446,757.

[51] Int. Cl.$^6$ .................................................. H04B 15/00
[52] U.S. Cl. .................................................. 375/206; 375/239
[58] Field of Search ................................. 375/200, 201, 375/205, 206, 208, 209, 210, 239; 370/441, 213, 208

[56] References Cited

U.S. PATENT DOCUMENTS 5,084,900  1/1992  Taylor ........................ 375/200

*Primary Examiner*—Stephen Chin
*Assistant Examiner*—Kevin Kim
*Attorney, Agent, or Firm*—Ladas & Parry

[57] ABSTRACT

A BPSK-MPP-DS-CDMA system is devised based on an M-ary pulse position modulated spreading-sequence signal. Under same bandwidth, same amount of energy used for one decision, and same bit error rate comparison conditions, if the number of users is less than the number $N_u$ of available sequence signals in the spreading sequence signal set $\{S_p(t)\}$ used in the BPSK-MPP-DS-CDMA system, the multiple access capacities of the BPSK-MPP-DS-CDMA system according to the present invention for M=4, M=8, and M=16 are improved by factors of at least 1.335, 1.66, and 1.65 over conventional BPSK-DS-CDMA systems. On the other hand, if the number of users reaches $N_u$, the multiple access capacity can not be increased futher, however, the bit error rate of the system still be reduced. Furthermore, significant amount of transmission energy is saved.

23 Claims, 23 Drawing Sheets

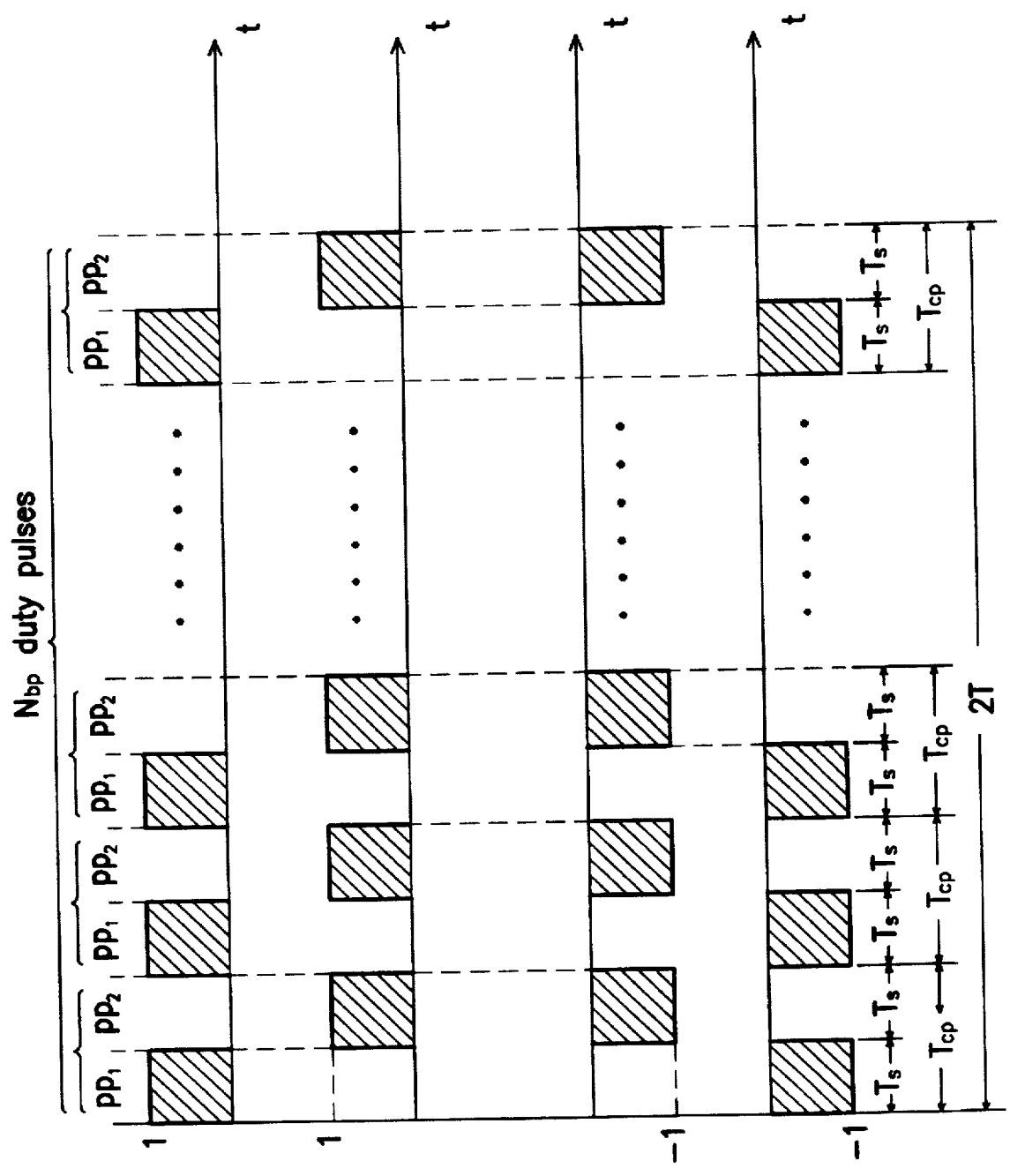
FIG. 4A (1,1)
FIG. 4B (1,-1)
FIG. 4C (-1,1)
FIG. 4D (-1,-1)

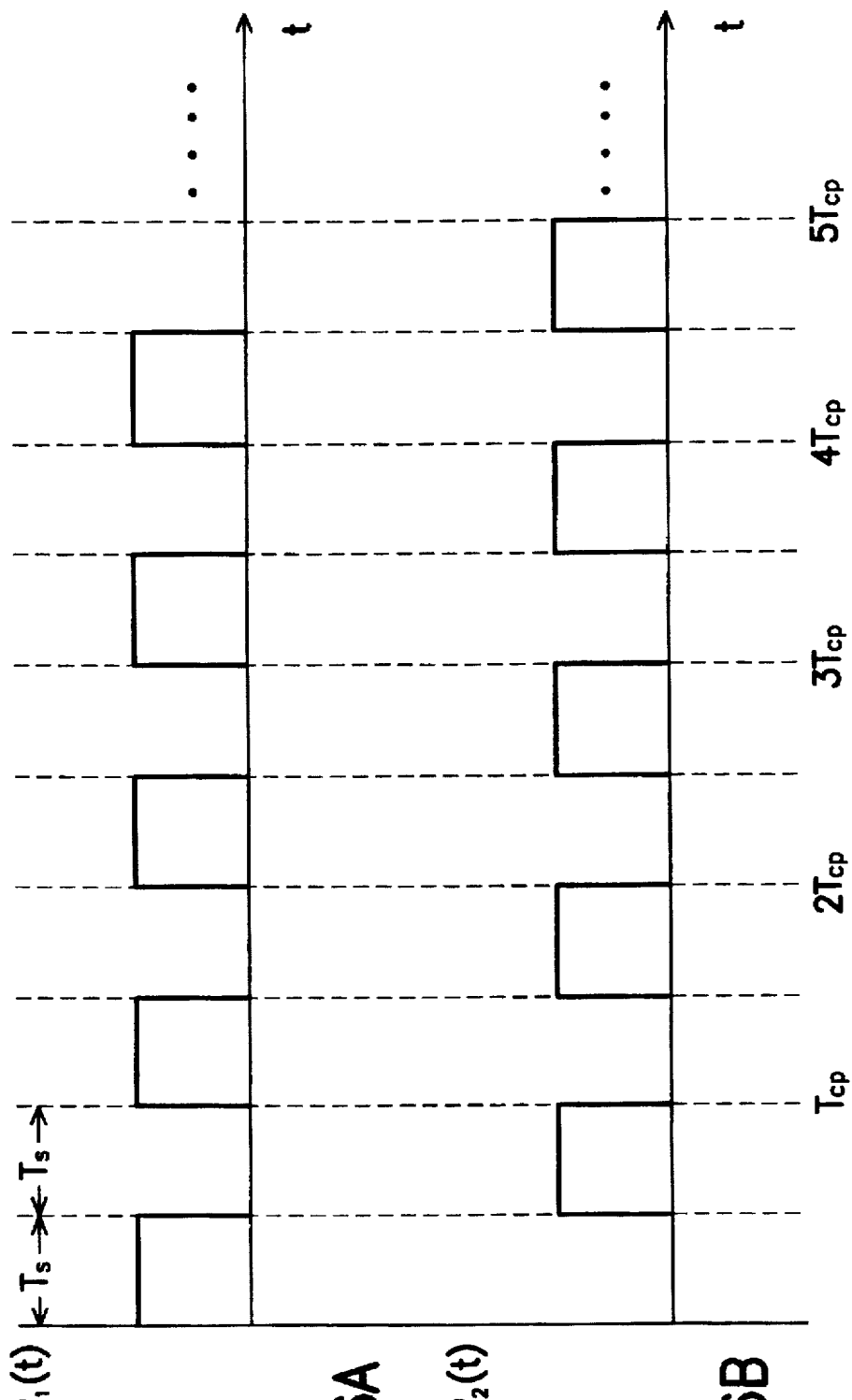

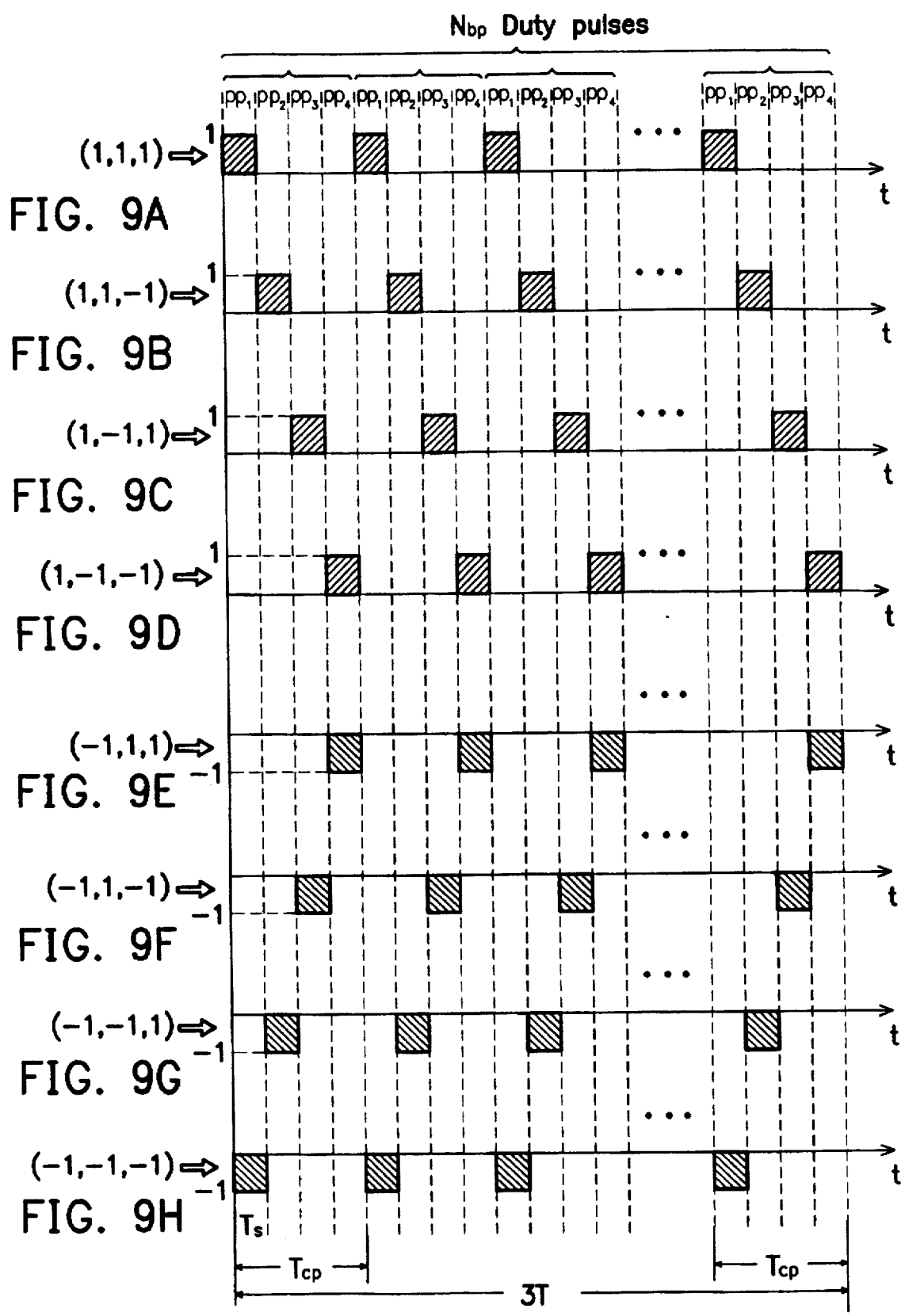

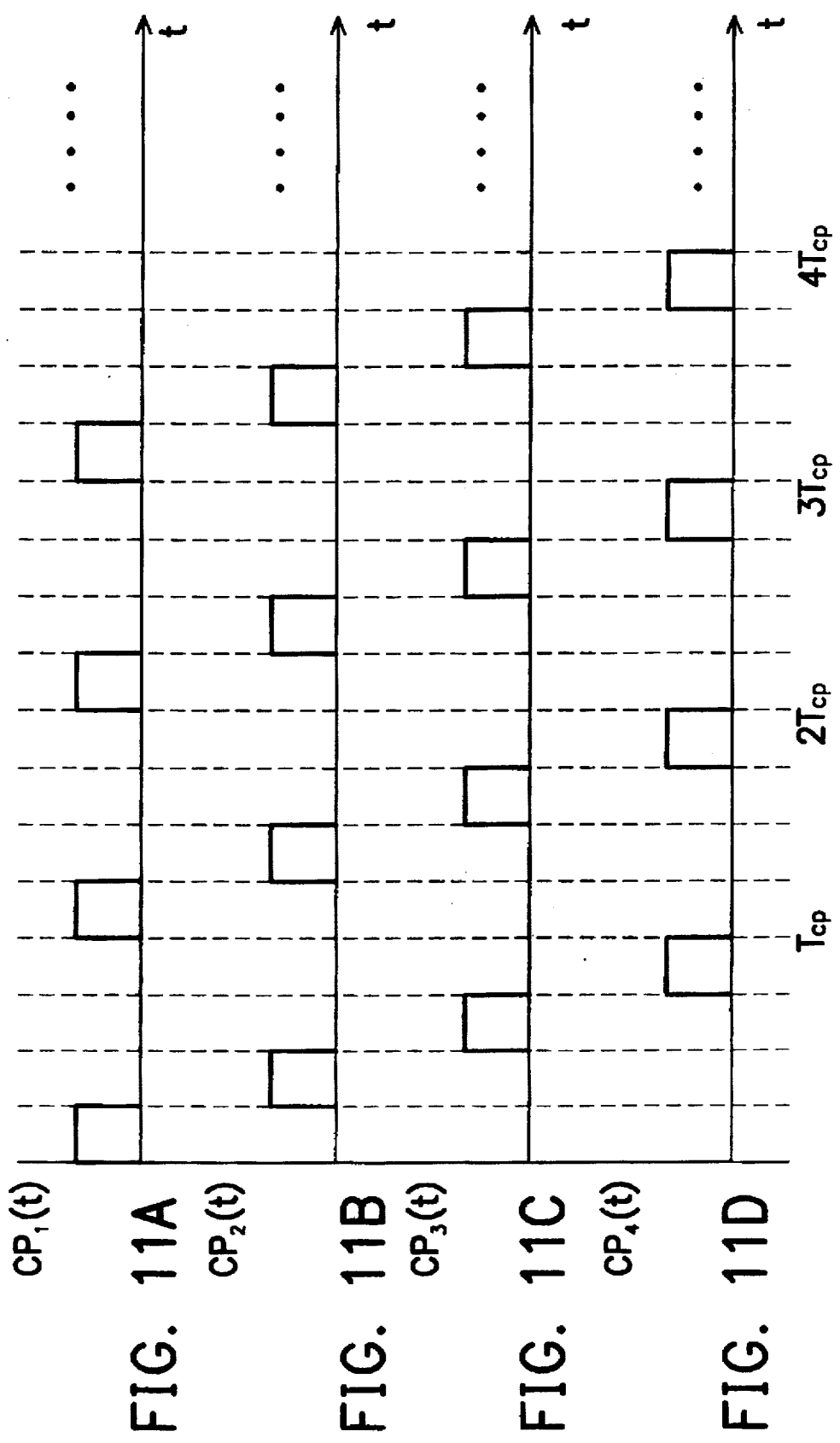

METHOD AND APPARATUS FOR IMPLEMENTING A DIRECT-SEQUENCE CODE DIVISION MULTIPLE ACCESS COMMUNICATION SYSTEM WITH AN M-ARY PULSE-POSITION MODULATED SPREADING-SEQUENCE SIGNAL

CROSS REFERENCE TO RELATED APPLICATION

This application is a continuation-in-part of U.S. patent application Ser. No. 08/077,347, filed Jun. 14, 1993, now U.S. Pat. No. 5,446,757 which is hereby incorporated by reference.

BACKGROUND OF THE INVENTION

1. Field of the Invention

The present invention relates in general to a method of data transmission and reception, specifically, to a method of data transmission and reception using code division multiple access (CDMA) techniques. Essentially, it is a main subsystem that provides spreading-sequence modulation, demodulation, and detection of a digital communication system employing direct-sequence spread spectrum techniques.

2. Description of Prior Art

The spread spectrum technique was developed in the mid-1950's, and a detailed description of conventional spread-spectrum systems can be found in "Theory of Spread Spectrum Communications—A Tutorial," by Raymond L. Pickholtz et al., published in IEEE Transactions on Communications, Vol. COM-30, NO. 5 pp. 855–884, May 1982.

A conventional Binary Phase Shift Keying-Direct Sequence-Spread Spectrum (BPSK-DS-SS) communication system is shown in FIGS. 1A–1B. A multiple access communication system that employs spread spectrum techniques is termed a "code division multiple access (CDMA) system." The configuration of a basic CDMA system is shown in FIG. 2. A more detailed description of the conventional BPSK-DS-SS (or BPSK-DS-CDMA) system shown in FIG. 1 is given below in the section following the sub-heading "Performance Evaluations."

The CDMA technique was developed mainly for reasons of capacity. Ever since analog cellular systems reached their capacity limits in 1987, research efforts have been devoted to improving the capacity of digital cellular systems. There are three basic multiple access schemes: frequency division multiple access (FDMA), time division multiple access (TDMA), and code division multiple access (CDMA). To aid understanding of the development of the present invention system and comparing it to the related systems, a list of references is given below:

[1] "Overview of Cellular CDMA", by William C. Y. Lee, IEEE Trans. Veh. Tech., Vol.40, No.2, pp. 291–302, May 1991.

[2] "On the Capacity of a Cellular CDMA System", by A. J. Viterbi, L. A. Weaver, and C. E. Wheatley III, IEEE Trans. Veh. Tech., Vol.40, No.2, pp. 303–312, May 1991.

[3] "A Statistical Analysis of On-off Patterns in 16 Conversations", by P. T. Brady, Bell Syst. Tech. J., Vol.47, pp. 73–91, January 1968.

[4] "Coherent Spread Spectrum Systems", by J. K. Holmes, John Wiley and Sons, New York, pp. 388–389, 1982.

[5] "Error Probability of Asynchronous Spread Spectrum Multiple Access Communications Systems", by K. Yao, IEEE Trans. Commum. Vol. COM-25, pp. 803–807, 1977.

[6] "Direct-Sequence Spread Spectrum Multiple-Access Communications with Random Signature Sequences: Large Deviations Analysis", by J. S. Sadowsky and R. K. Bahr, IEEE Trans. Inform. Theory Vol.37, No. 3, pp. 514–527, May 1991.

[7] "Digital Communications and Spread Spectrum Systems", by R. E. Ziemer and R. L. Peterson, Macmillan, New York, Ch.11, 1985.

[8] "Spread Spectrum Multiple Access Communications, Multi-User communication Systems", by M. B. Pursley, edited by G. Longo, Springer-Verlag, New York pp. 139–199, 1981.

[9] "Performance Evaluation for Phase-Coded Spread-Spectrum Multiple-Access Communication—Part II: Code Sequence Analysis", by M. B. Pursley and D. V. Sarwate, IEEE Trans. Commun., Vol. Com-25, No.8, pp. 800–803, August 1977.

Remarkable results have been derived in pertinent reference [2], "On the Capacity of a Cellular CDMA System" by A. J. Viterbi et al. This paper shows that the net improvement in capacity provided by CDMA systems is four to six times greater than that of digital TDMA or FDMA systems, and nearly 20 times greater than that of current analog FM/FDMA systems. Therefore, CDMA may become a major communication system scheme in the future.

CDMA systems improve multiple access capacity because the capacity of a CDMA system is inversely proportional to the power of cross-correlation noise which is influenced and can be reduced by: (1) voice activity with a duty factor of approximately $\frac{3}{8}$, and (2) spatial isolation through use of multi-beamed or multi-sectored antennas. Therefore if we can find another factor that reduces the power of cross-correlation noise, multiple-access capacity will be increased correspondingly.

SUMMARY OF THE INVENTION

The primary object of the present invention is to provide a CDMA system with greater multiple access capacity that requires less transmission energy than conventional BPSK-DS-CDMA systems. Accordingly, a CDMA system based on an M-ary pulse-position modulated spreading-sequence signal is developed. This system is called a BPSK-MPP-DS-CDMA (Binary Phase Shift Keyed-M-ary Pulse Position Modulated-Direct Sequence-CDMA) system. The data source in this system sends out a sequence of data bits with a bit duration T. The system of the present invention first converts the serial data bit stream into K parallel bit sequences. These K parallel bit sequences can be considered as a sequence of K-bit vectors with each bit having a duration of KT. An integer $N_{bp}$ is selected to divide each KT into $N_{bp}$ intervals, with each interval having a duration of $T_{cp}$, $T_{cp}=KT/N_{bp}$. A spreading-sequence signal $S_p^i(t)$ in a spreading-sequence signal set $\{S_p(t)\}$, which contains $N_u$ pseudorandom sequence, Gold code, or orthogonal code signals, is then chosen as the signature of the i-th user. The spreading-sequence signal $S_p^i(t)$ has a period of $N_{cp}$ and has a chip duration equal to $T_{cp}$. Each $T_{cp}$ is further divided into M pulse positions, where $M=2^{K-1}$, and each pulse position has a duration of $T_s$, $T_s=T_{cp}/M$. Then each K-bit vector is converted into a corresonding package of $N_{bp}$ duty-pulses in every duration KT with each duty-pulse set according to a preselected mapping table to appear in one of the M pulse-positions with a certain polarity. This duty-pulse train is then modulated with the spreading-sequence signal $S_p^i(t)$. The modulated signal is further modulated by a carrier signal and transmitted to a channel of the communication system.

At the receiving end of the communication system, the received signal is synchronously demodulated by a locally generated carrier signal and spreading-sequence signal $S_p^i(t)$ to recover each duty-pulse package in duration KT. The pulse-position and polarity of $N_{bp}$ pulses in each received duty-pulse package are determined and are used to find the bit pattern represented by each received duty-pulse package by referring to the mapping table mentioned above. In this way, the sequence of K-bit vectors transmitted from of the transmitter are recovered from the received signal.

Under same comparison condition that the energy used for one decision (this energy is defined in paragraphs under the sub-heading "Performance Evaluations") in all concerned systems is equal, the present invention system (BPSK-MPP-DS-CDMA system) has three favorable characteristics when compared to conventional BPSK-DS-CDMA systems. These characteristics include reducing the power of cross-correlation noise, increasing multiple access capacity, and reducing transmission energy.

The power of cross-correlation noise is reduced by a factor of K if M pulse-positions are used in the system. For the cases that the corresponding multiple access capacity is not limited by the number $N_u$ of available sequence signals in the spreading-sequence signal set $\{S_p(t)\}$, then under same bandwidth and same bit error rate comparison conditions, the multiple access capacity is improved by a factor of at least 1.335 if the system is based on K=3; 1.66 if the system is based on K=4; and 1.65 if the system is based on K=5. Conversely, when the multiple access capacity is limited by $N_u$, that is, when the number of user's has reached $N_u$, the reduced cross-correlation noise power still reduces the bit error rate of the system.

For an M-ary system of the present invention, tramsmission energy is only 1/K of that used by conventional systems, i.e., (K−1)/K of transmission energy is saved.

The proofs of these results are given below in paragraphs under the sub-heading "Performance Evaluations" of preferred embodiments.

BRIEF DESCRIPTION OF THE DRAWINGS

The present invention can be more fully understood by reading the detailed descriptions of the preferred embodiments, and referring to the accompanying drawings, wherein.

For the Conventional BPSK-DS-SS System.

Figure 3A:
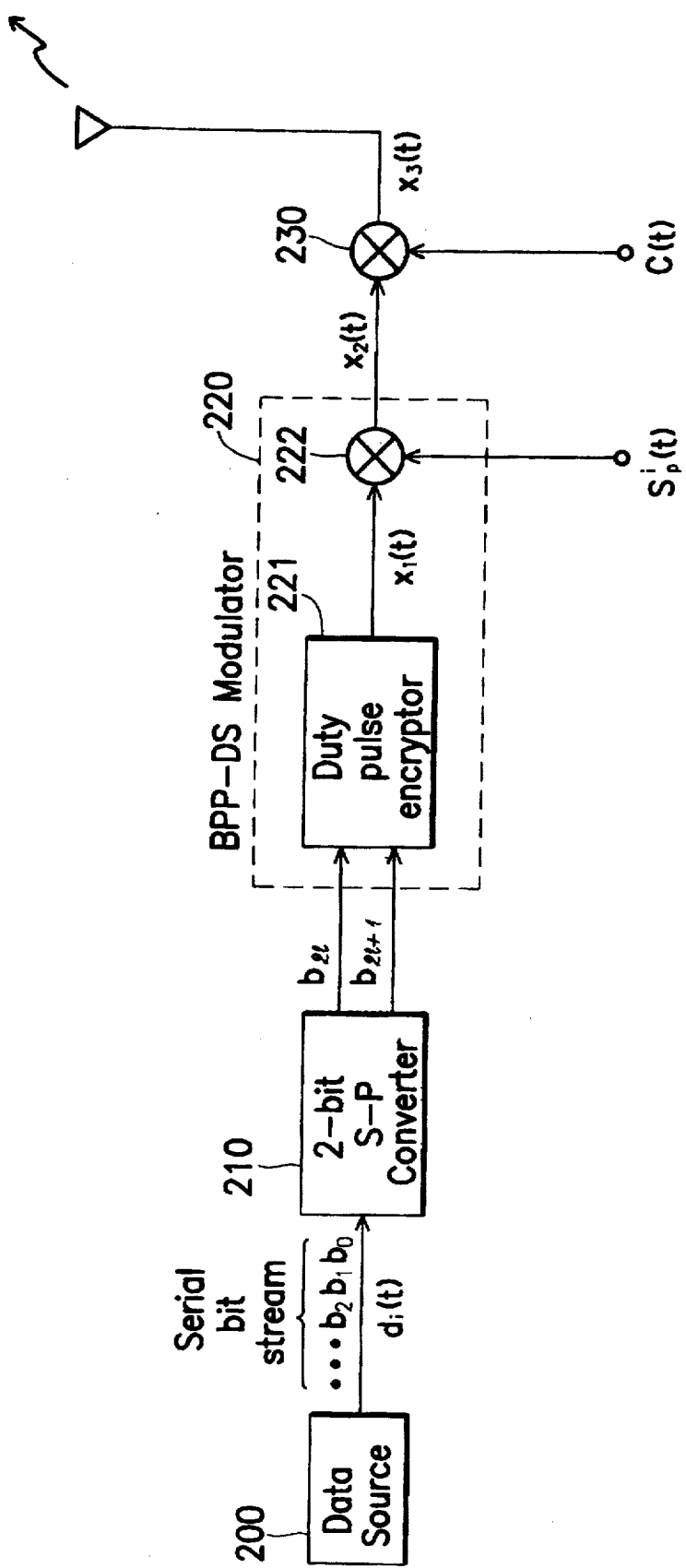
Figure 3B:
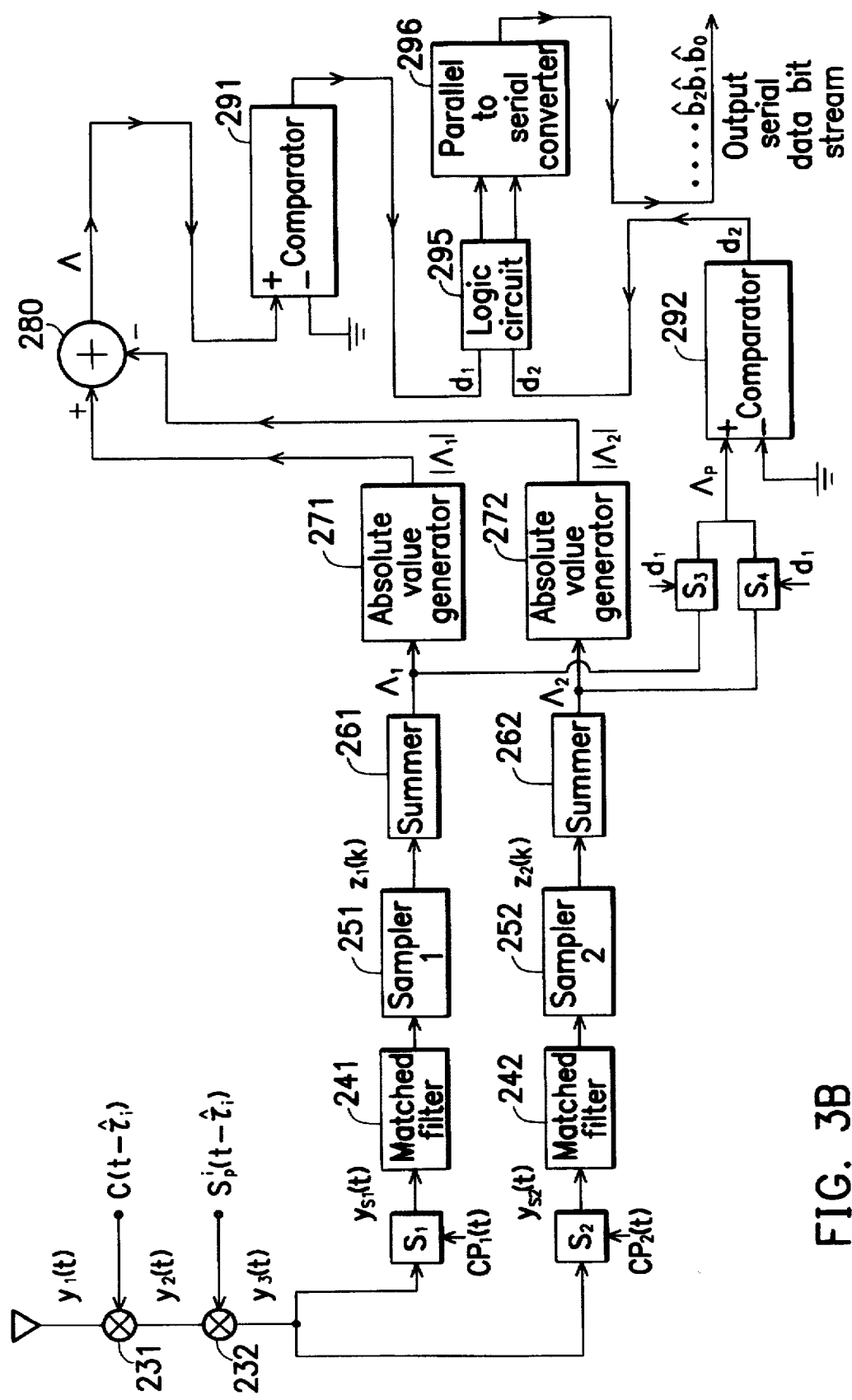
Figures 5A, 5B:
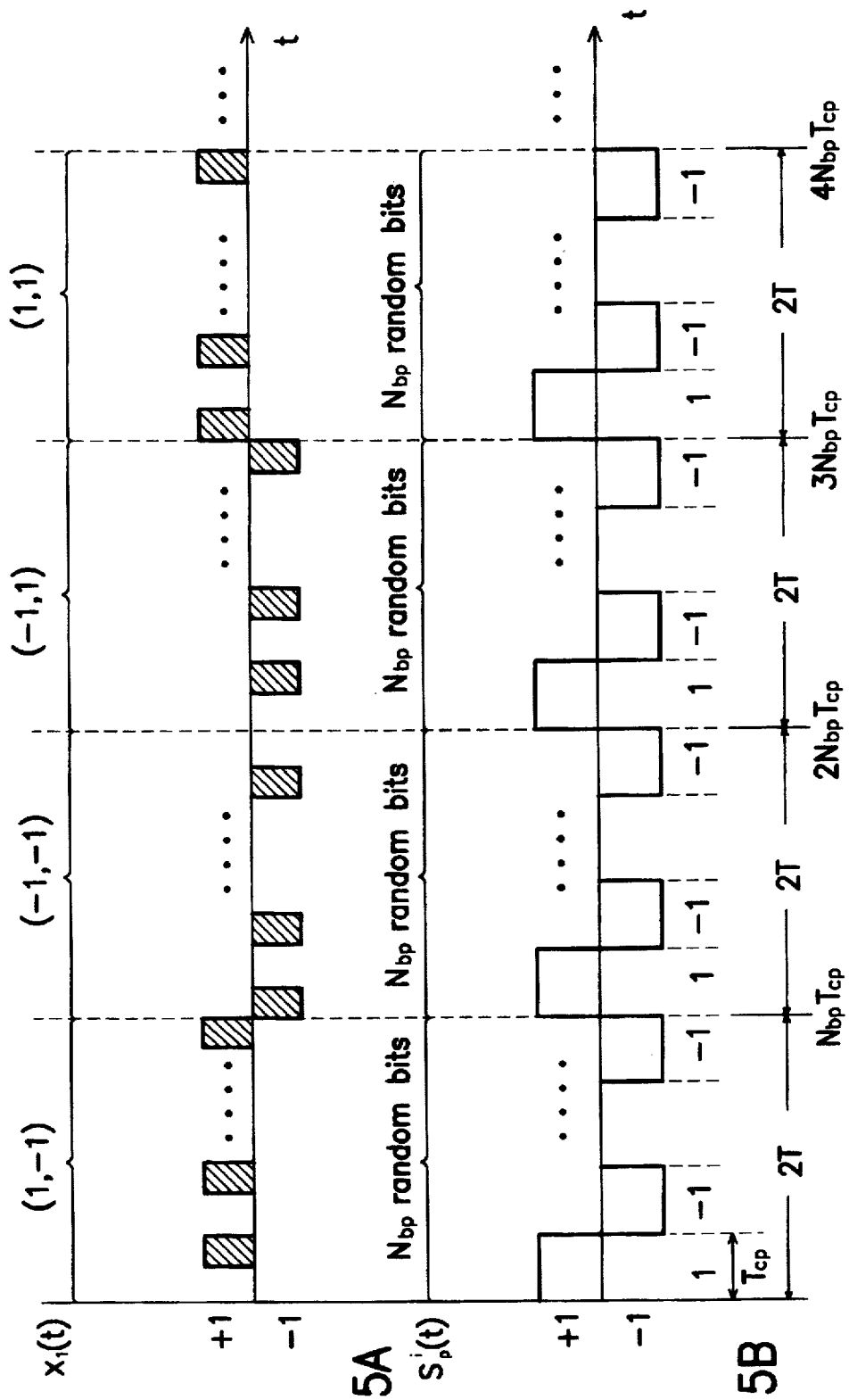
Figure 7:
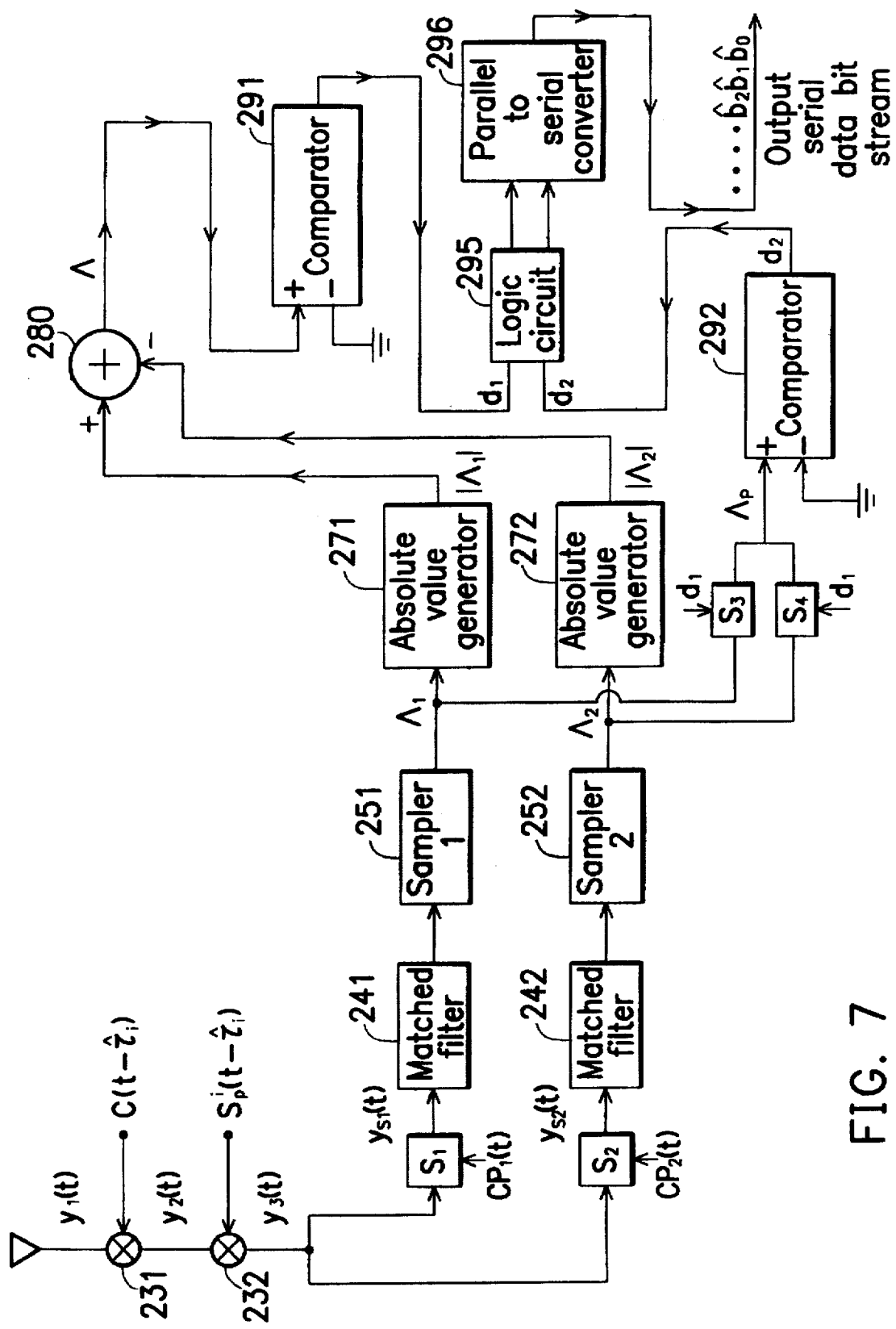
Figure 8A:
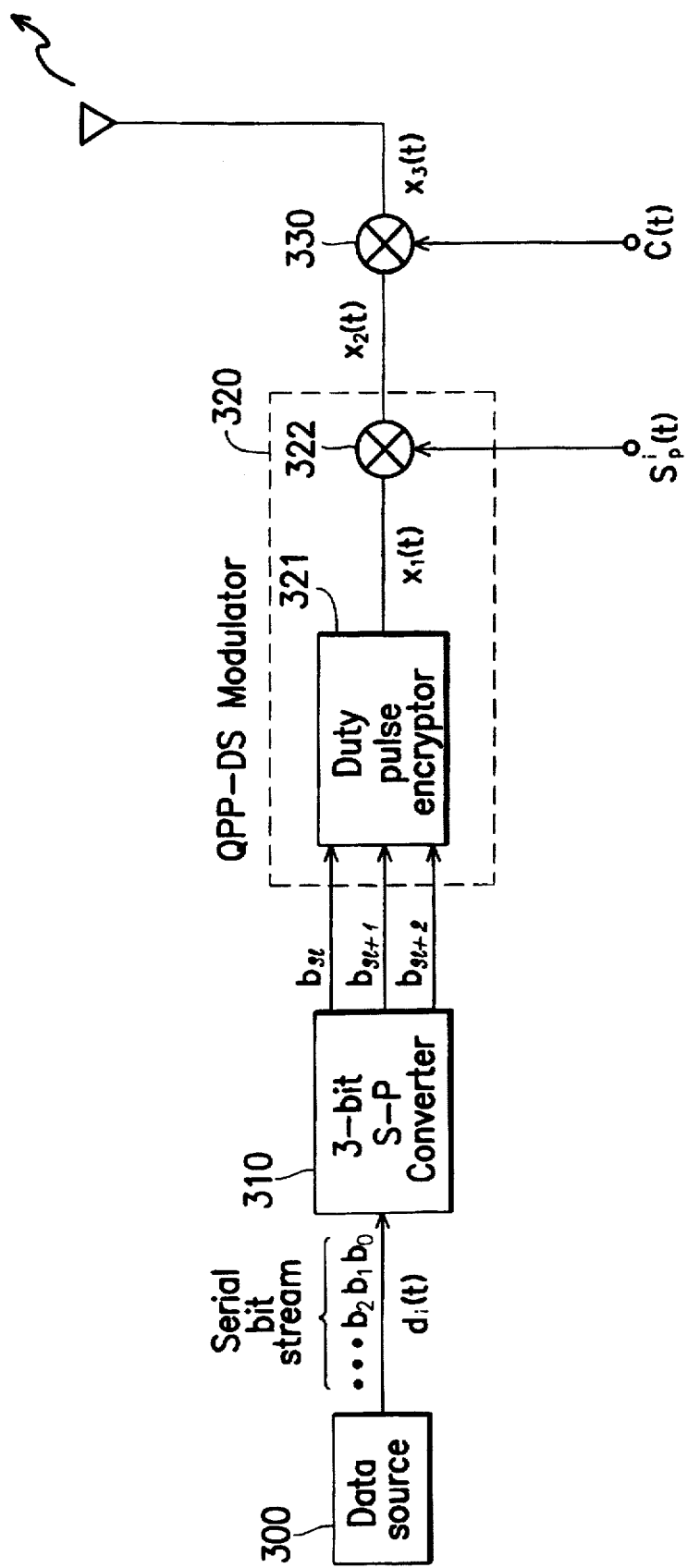
Figure 8B:
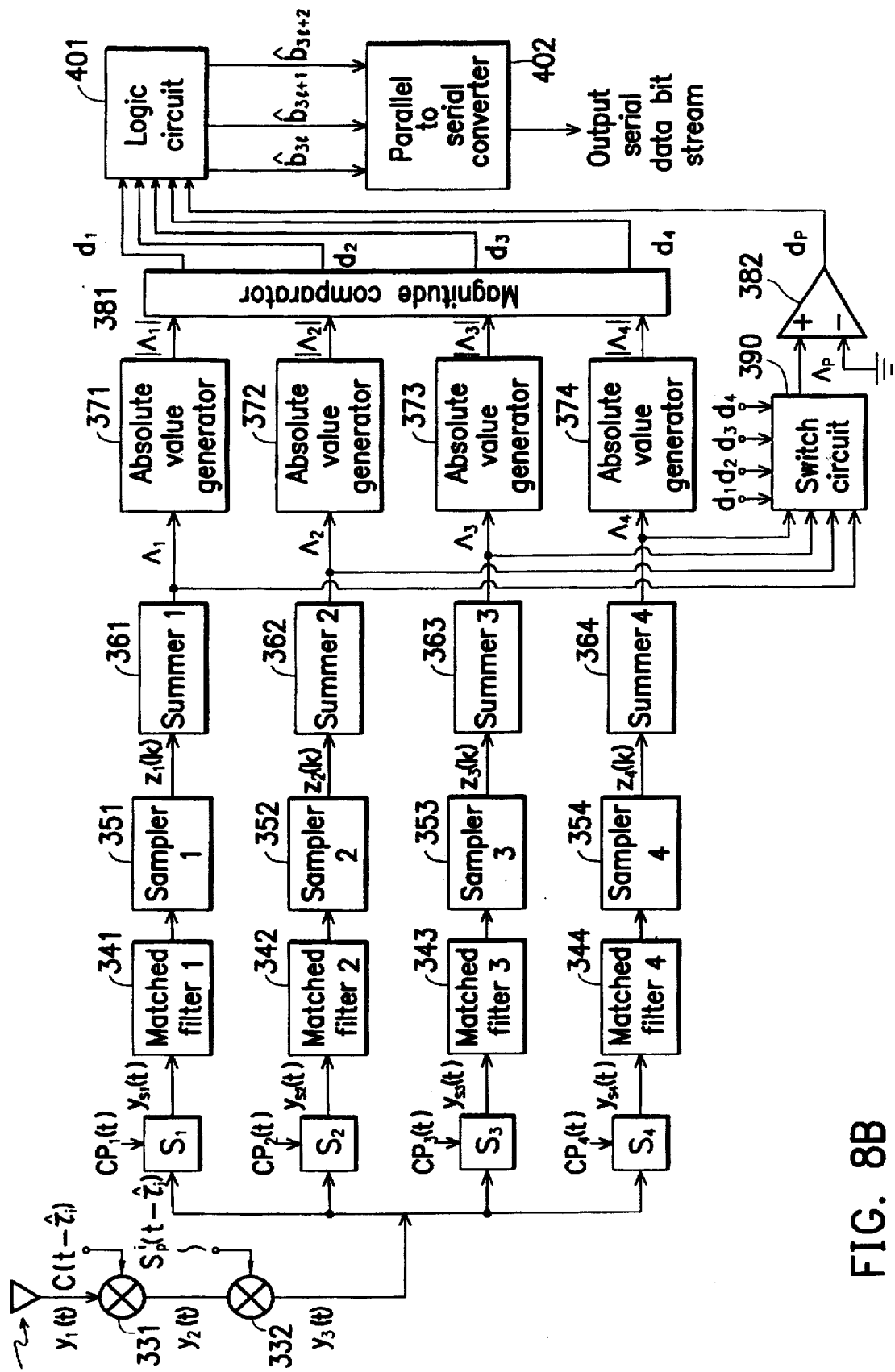
Figures 10A, 10B:
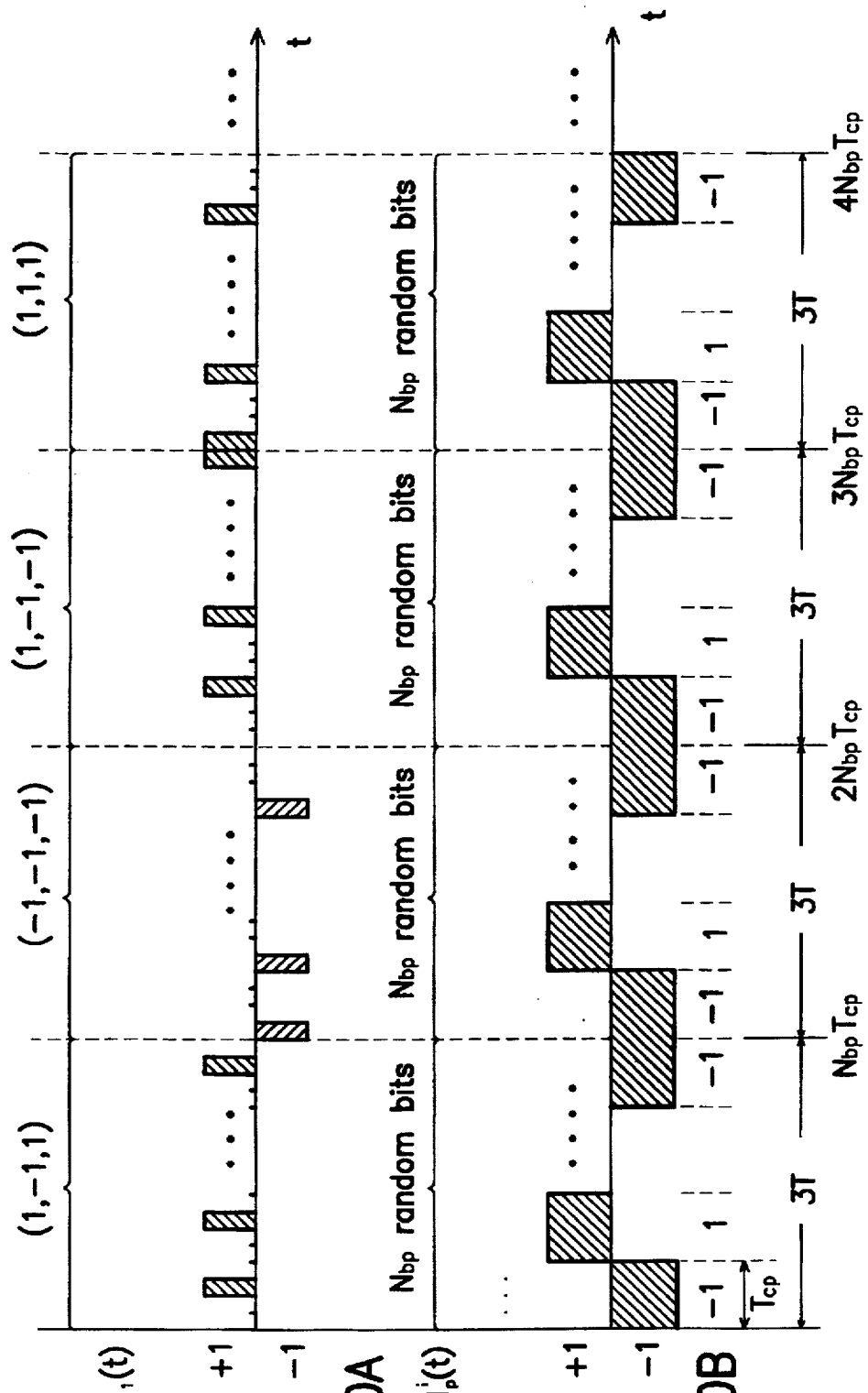
Figure 12:
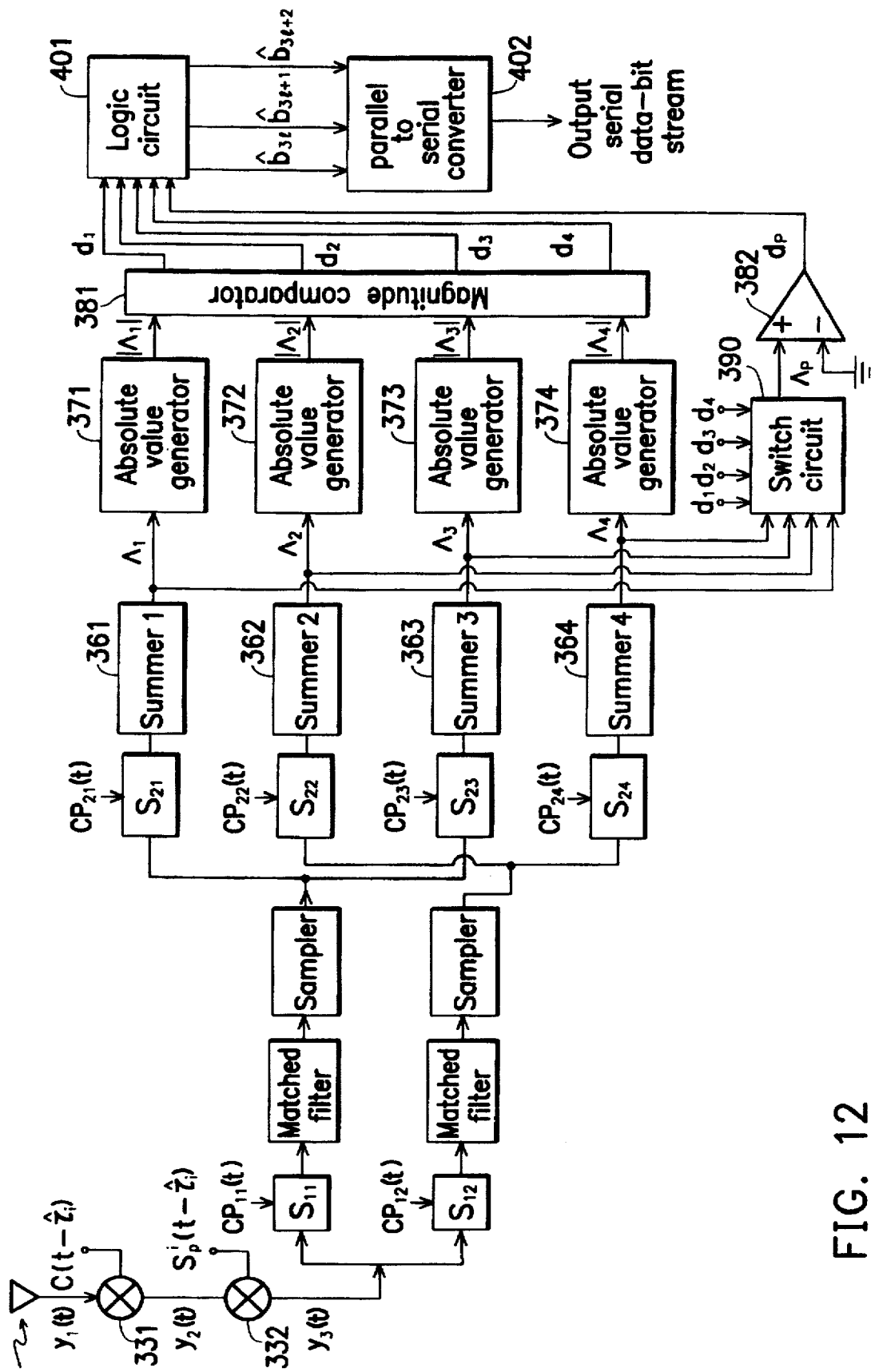
Figure 13:
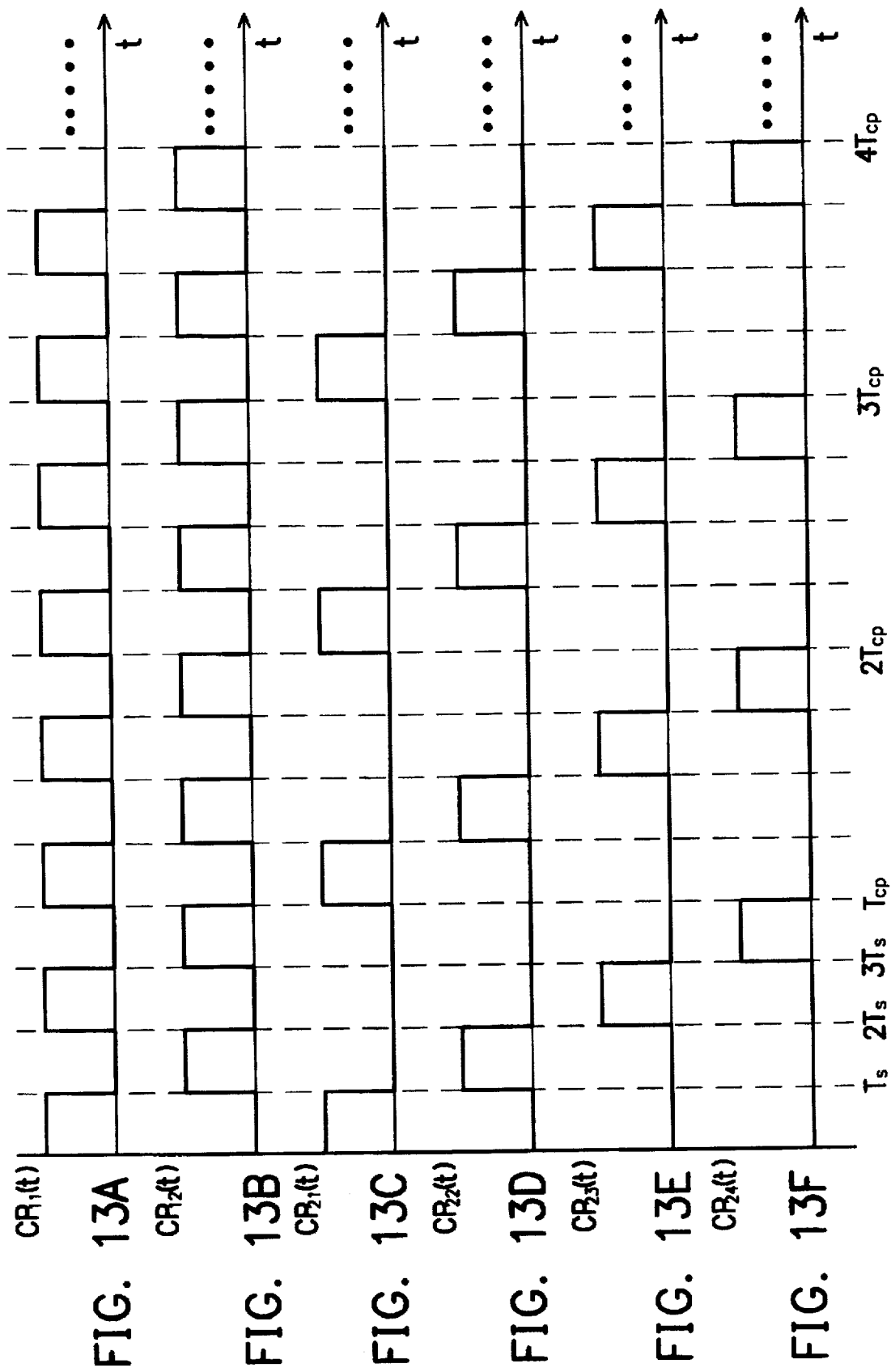
Figure 14:
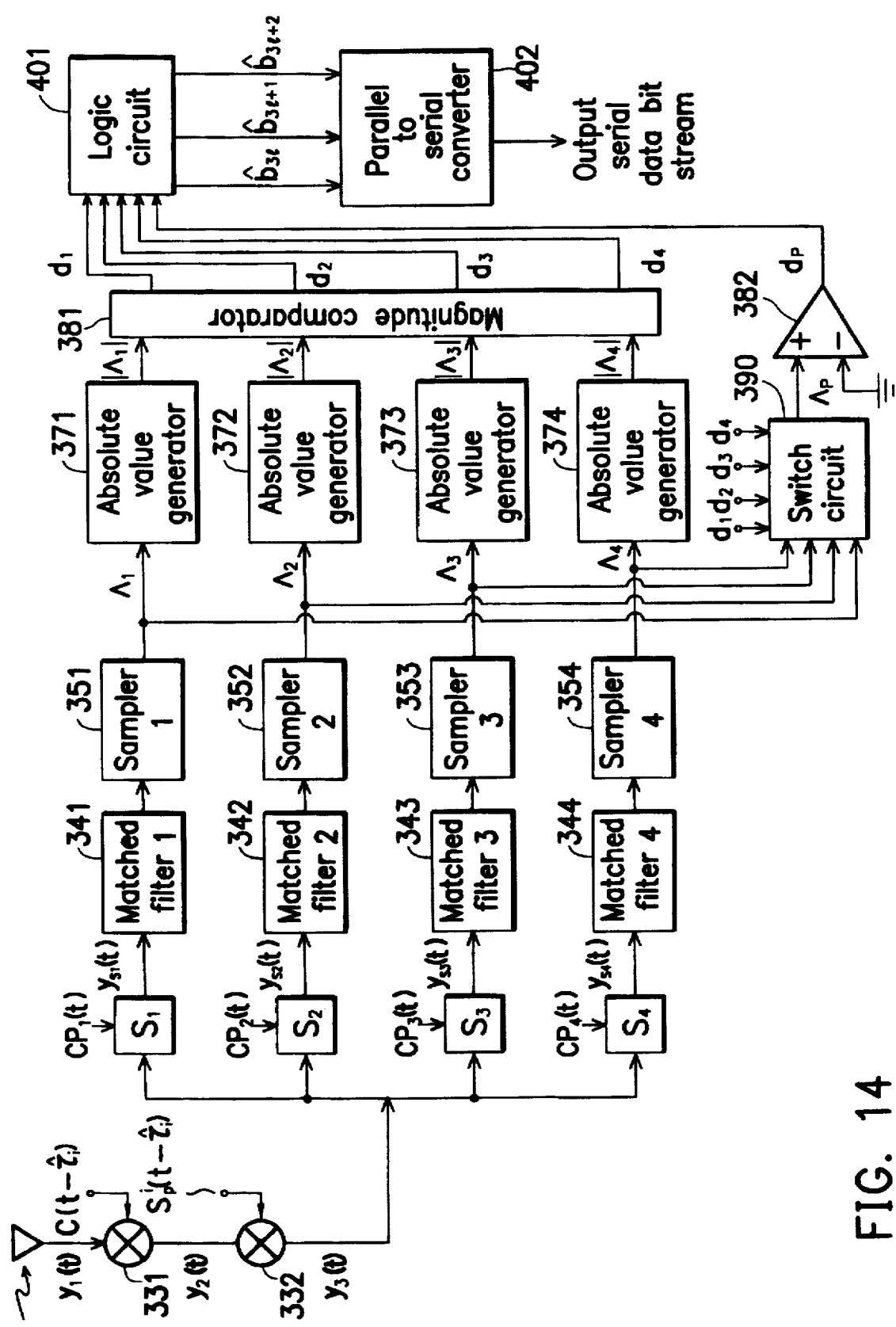
Figure 15A:
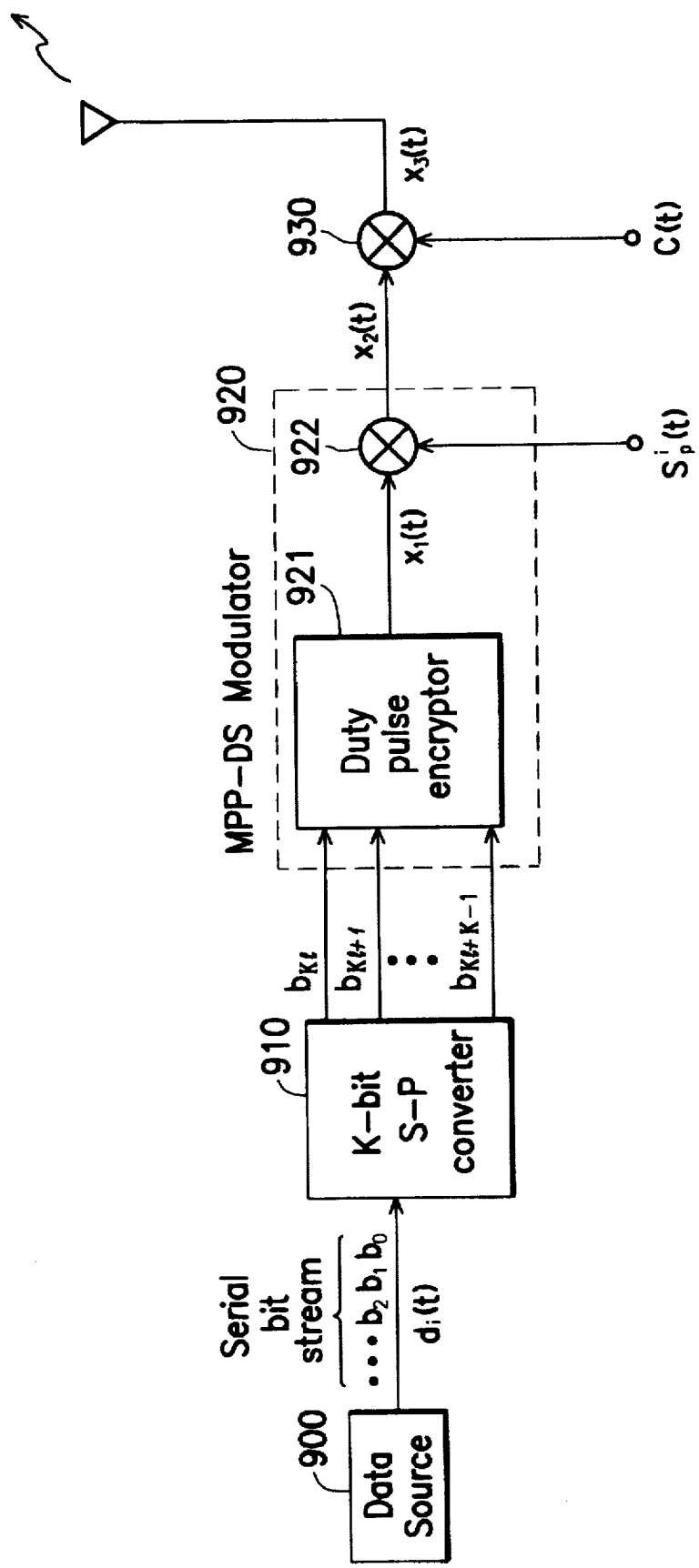
Figure 15B:
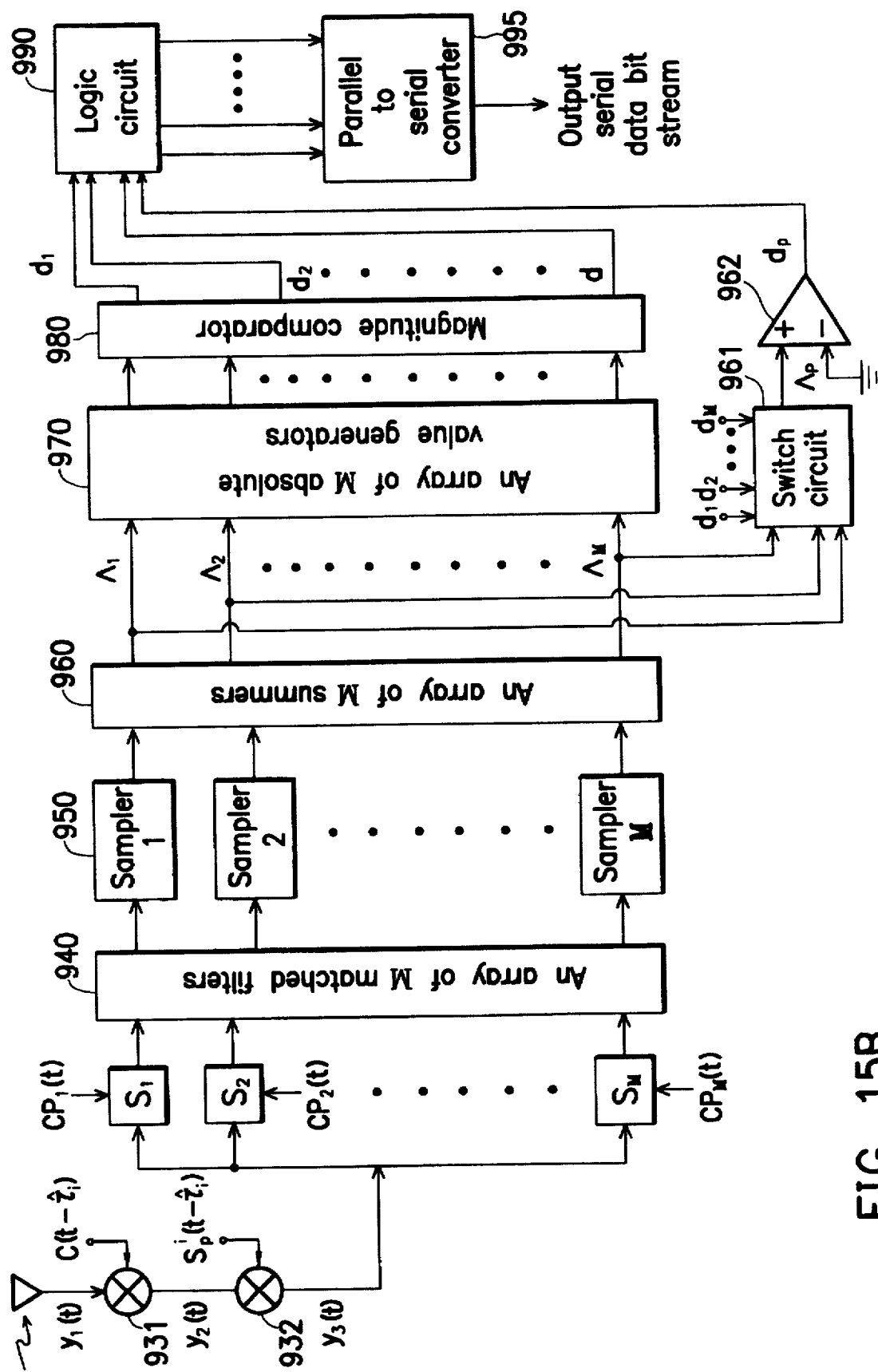
Figure 16A:
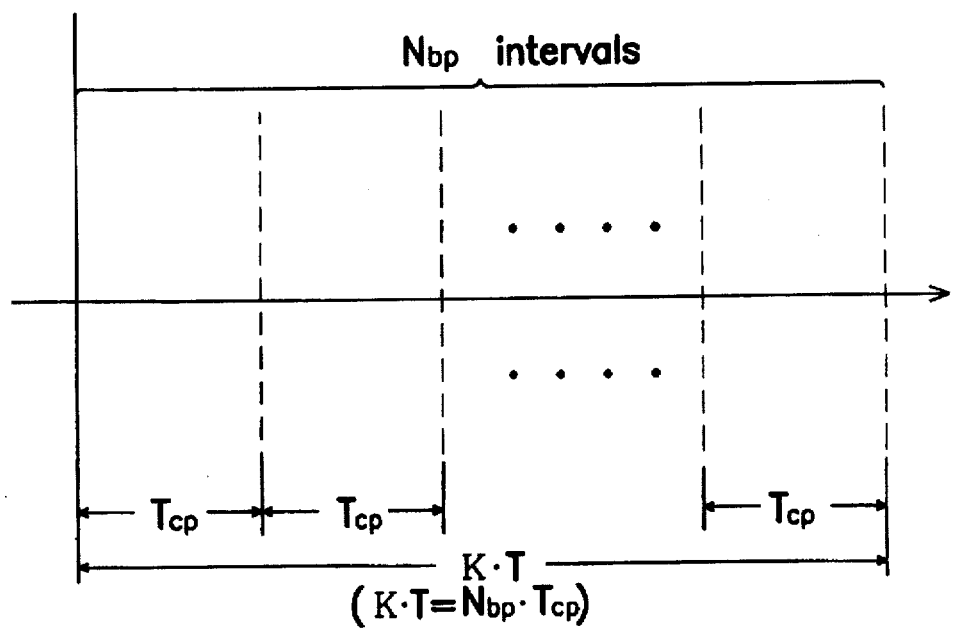
Figure 16B:
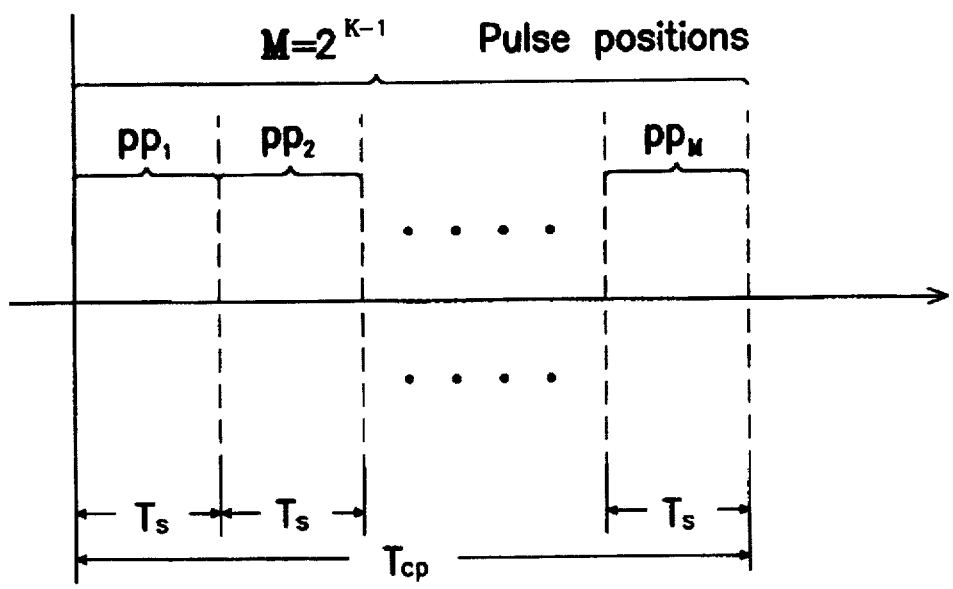
Figure 17A:
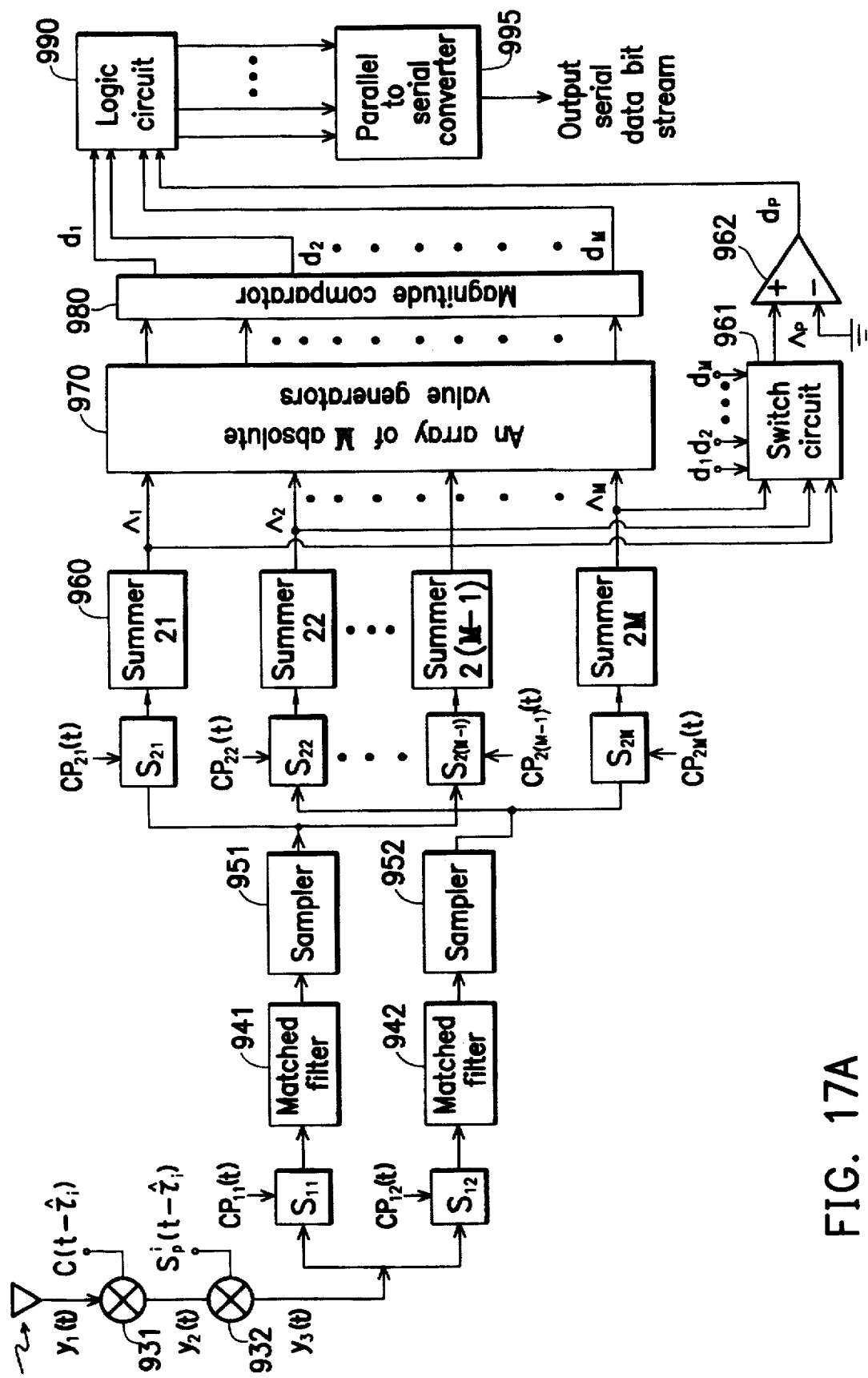
Figure 17B:
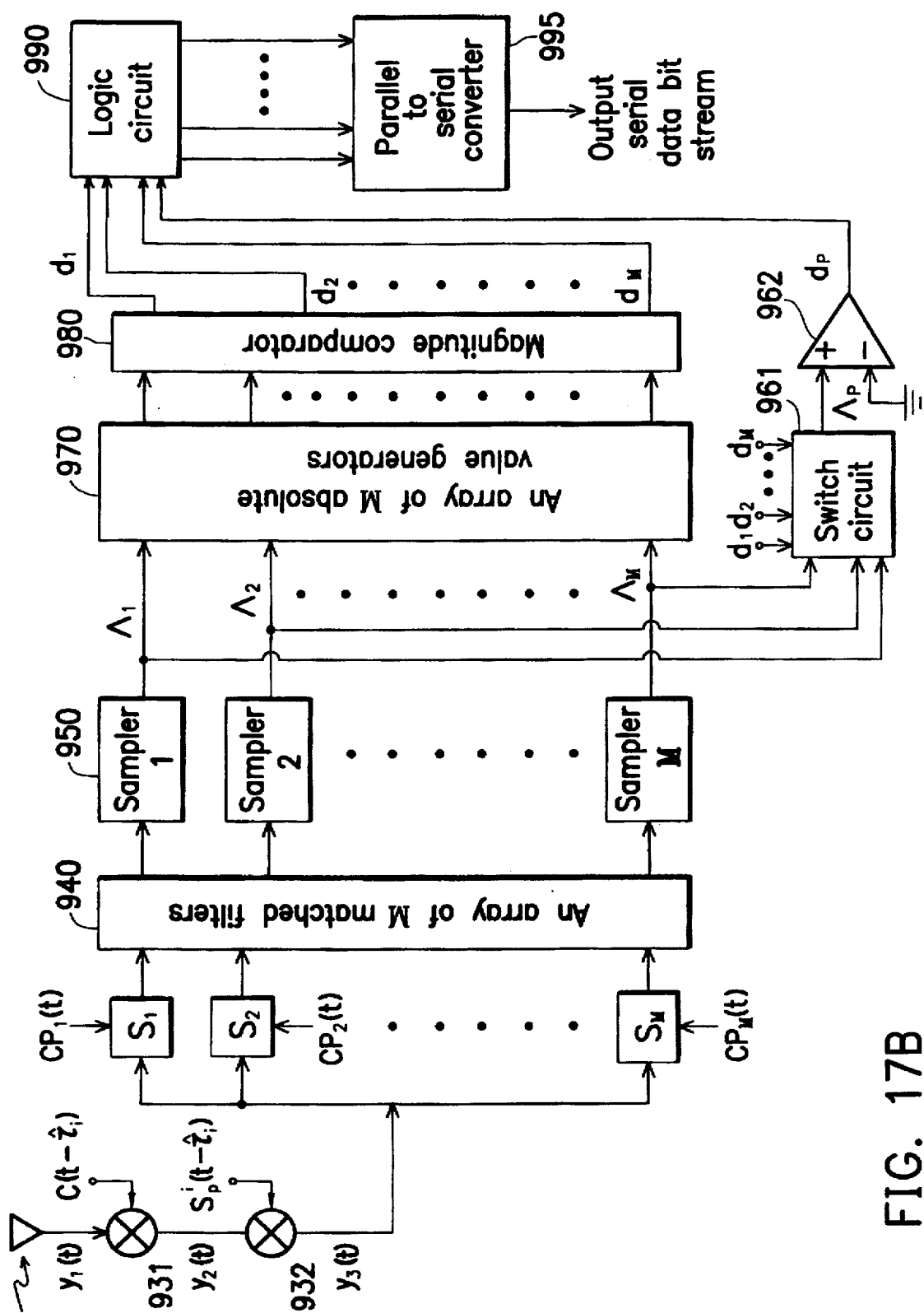
Figure 18A:
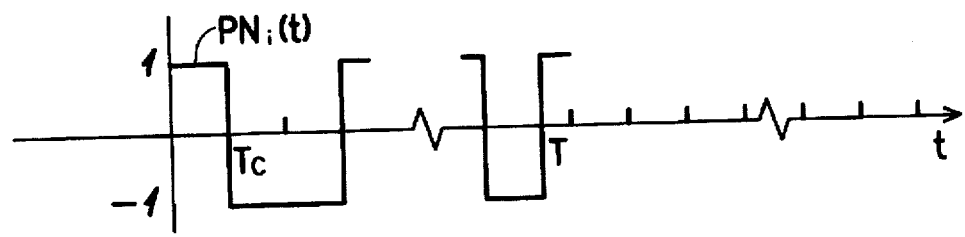
Figure 18B:
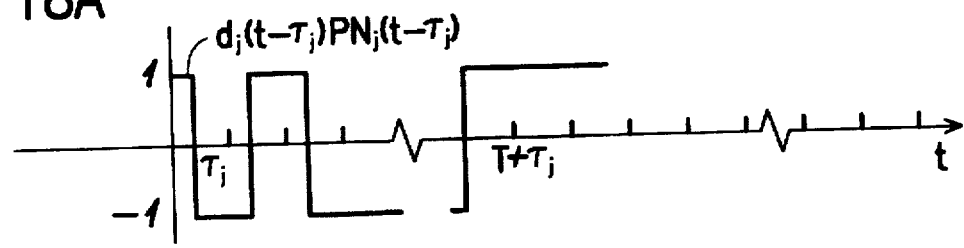
Figure 18C:
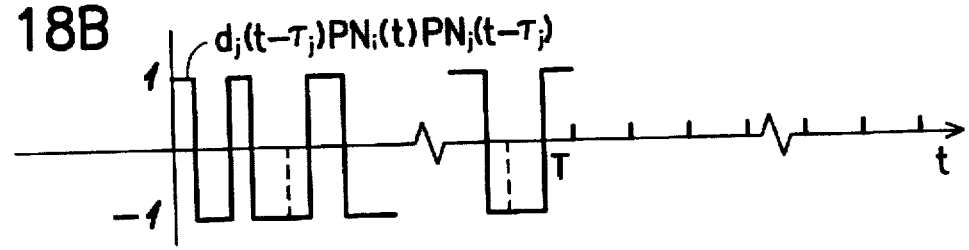

For the BPSK-BPP-DS-CDMA System:

FIG. 3A shows a block diagram of a BPSK-BPP-DS-CDMA transmitter devised in accordance with the present invention;

FIG. 3B shows a block diagram of a BPSK-BPP-DS-CDMA receiver devised in accordance with the present invention;

FIGS. 4A–4D show four duty-pulse package patterns generated in response to four possible 2-bit vector patterns;

FIG. 5A shows an example of the waveform of an encrypted duty-pulse train;

FIG. 5B shows an example of a spreading-sequence signal for modulating the pulse train shown in FIG. 5A;

FIGS. 6A–6B show two control-pulse trains for respectively controlling the ON/OFF operations of switches $S_1$ and $S_2$ in the receiver shown in FIG. 3B;

FIG. 7 shows the block diagram of another type of BPSK-BPP-DS-CDMA receiver devised in accordance with the present invention;

For the BPSK-QPP-DS-CDMA System:

FIG. 8A shows a block diagram of a BPSK-QPP-DS-CDMA transmitter devised in accordance with the present invention;

FIG. 8B shows a block diagram of a BPSK-QPP-DS-CDMA receiver devised in accordance with the present invention;

FIGS. 9A–9H show eight duty-pulse package patterns generated in response to eight possible 3-bit vector patterns;

FIG. 10A shows an example of the waveform of an encrypted duty pulse train;

FIG. 10B shows an example of a spreading-sequence signal for modulating the pulse train shown in FIG. 10A;

FIGS. 11A–11D show four control-pulse trains for respectively controlling the ON/OFF operations of switches $S_1$, $S_2$, $S_3$, and $S_4$ in the receiver shown in FIG. 8B;

FIG. 12 shows the block diagram of a Type 2 BPSK-QPP-DS-CDMA receiver devised in accordance with the present invention;

FIGS. 13A–13F show six control-pulse trains for respectively controlling the ON/OFF operations of the switches $S_{11}$, $S_{12}$, $S_{21}$, $S_{22}$, $S_{23}$, and $S_{24}$ in the receiver shown in FIG. 12;

FIG. 14 shows the block diagram of a Type 3 BPSK-QPP-DS-CDMA receiver devised in accordance with the present invention;

For the BPSK-MPP-DS-CDMA System:

FIG. 15A shows a block diagram of a BPSK-MPP-DS-CDMA transmitter devised in accordance with the present invention;

FIG. 15B shows a block diagram of a BPSK-MPP-DS-CDMA receiver devised in accordance with the present invention; and FIGS. 16A–16B depict the pulse-position forming procedure for the M-ary system of the present invention;

FIG. 17A shows the block diagram of a Type 2 BPSK-MPP-DS-CDMA receiver devised in accordance with the present invention;

FIG. 17B shows the block diagram of a Type 3 BPSK-MPP-DS-CDMA receiver devised in accordance with the present invention;

For Performance Evaluations:

FIGS. 18A–18C show the forming process of an example of the cross-correlated waveform of $d_j(t-\tau_j)PN_i(t)PN_j(t-\tau_j)$ for conventional BPSK-DS-CDMA systems.

FIGS. 19A–19D show the forming process of an example of two cross-correlated waveforms of $d_A(t-\tau_A)PN_c^A(t-\tau_A)PN_p^i(t)P_u^i(t)$ and $d_B(t-\tau_B)PN_c^B(t-\tau_B)PN_p^i(t)P_u^i(t)$ for the present invention BPSK-BPP-DS-CDMA system.

DETAILED DESCRIPTIONS OF THE PREFERRED EMBODIMENTS

The present invention relates to spread spectrum communication systems and is based on an M-ary pulse-position modulated spreading-sequence signal. In the following detailed descriptions, examples of cases of M=2 and M=4 are given. Finally, a BPSK-MPP-DS-CDMA system is described.

Example 1

A BPSK-BPP-DS-CDMA System (K=2, M=2)

Refer to FIGS. 3A–3B. These show a BPSK-BPP-DS-CDMA (binary phase shift keyed-binary pulse position modulated-direct sequence-code division multiple access) system devised in accordance with the present invention. The transmitter is shown in FIG. 3A and the receiver is shown in FIG. 3B.

The transmitter that transmits binary signals from data source 200 to a communication channel includes 2-bit serial-to-parallel converter 210, BPP-DS modulator 220, and carrier modulator 230. The BPP-DS modulator 220 consists of duty-pulse encryptor 221 and pulse modulator 222.

In practice, a data bit "1" is represented by a positive square pulse with a time duration T and a data bit "−1" is represented by a negative square pulse also with a time duration T at the output of data source 200. When a data bit stream BS=(b$_0$, b$_1$, b$_2$, ..., b$_{n-1}$ ...) is sent out by data source 200 for transmission through the communication channel to the receiver, the data bit stream BS is first converted by serial-to-parallel converter 210 into two parallel bit streams BS$_1$ and BS$_2$, BS=(b$_0$, b$_2$, b$_4$, ..., b$_{2l}$, ...) and BS$_2$=(b$_1$, b$_3$, b$_5$, ..., b$_{2l+1}$, ...). However, the time duration of each bit in BS$_1$ and BS$_2$ is 2T. Consequently, serial-to-parallel converter 210 sends out a sequence of 2-bit vectors (b$_{2l}$, b$_{2l+1}$), l=0, 1, 2, ..., to BPP-DS modulator 220. Each 2-bit vector thus formed is a bit pattern of the four possible bit patterns listed in Table A1.

TABLE A1

| (b$_{2l}$, b$_{2l+1}$) |
|---|
| (1, 1) |
| (1, −1) |
| (−1, 1) |
| (−1, −1) |

In BPP-DS modulator 220, each 2-bit vector is first converted by duty-pulse encryptor 221 into a duty-pulse package and then modulated in pulse modulator 222 with a spreading-sequence signal S$_p^i$(t). In the present invention, an integer N$_{bp}$ is selected to divide each duration 2T into N$_{bp}$ equal intervals with each interval having a duration of T$_{cp}$, T$_{cp}$=2T/N$_{bp}$. The duration T$_{cp}$ is also used as the chip duration of the spreading-sequence signal S$_p^i$(t). Each T$_{cp}$ is further divided into two pulse-positions (in general the number of pulse-positions is equal to the M in the M-ary system). The duration of each pulse-position is T$_s$, T$_s$=T$_{cp}$/2. The two pulse-positions within each T$_{cp}$ are termed "PP$_1$" and "PP$_2$", respectively.

The duty-pulse encryptor 221 includes a built-in one-to-one mapping table. The mapping table defines the generation of duty-pulse packages in response to possible bit patterns of the 2-bit vector (b$_{2l}$, b$_{2l+1}$). The preferred embodiment of the present invention incorporates a mapping table having the following mapping relationships:

(a) if the input 2-bit vector is (1, 1), then duty-pulse encryptor 221 sends out a package of N$_{bp}$ consecutive positive square pulses with pulse duration T$_s$ during the interval 2T and with each square pulse appearing at pulse-position PP$_1$;

(b) if the input 2-bit vector is (1,−1), then duty-pulse encryptor 221 sends out a package of N$_{bp}$ consecutive positive square pulses with pulse duration T, during the interval 2T and with each square pulse appearing at pulse position PP$_2$;

(c) if the input 2-bit vector is (−1, 1), then duty-pulse encryptor 221 sends out a package of N$_{bp}$ consecutive negative square pulses with pulse duration T, during the interval 2T and with each square pulse appearing at pulse position PP$_2$; and (d) if the input 2-bit vector is (−1,−1), then duty-pulse encryptor 221 sends out a package of N$_{bp}$ consecutive negative square pulses with pulse duration T$_s$ during the period 2T and with each square pulse appearing at pulse position PP$_1$.

These mapping relationships are presented in Table A2 and also depicted in FIGS. 4A–4D.

TABLE A2

| Bit Pattern | Encrypted Duty-Pulses | |
|---|---|---|
| (b$_{2l}$, b$_{2l+1}$) | Pulse-Position | Polarity |
| (1, 1) | PP$_1$ | +1 |
| (1, −1) | PP$_2$ | +1 |
| (−1, 1) | PP$_2$ | −1 |
| (−1, −1) | PP$_1$ | −1 |

The square pulse in each chip T$_{cp}$ is called a "duty-pulse." Only one duty-pulse is present in each chip T$_{cp}$. For example, if the eight leading bits in bit stream BS are (1, −1, −1, −1, −1, 1, 1, 1), then duty-pulse encryptor 221 sends out the corresponding signal x$_1$(t) illustrated in FIG. 5A. The signal x$_1$(t) is subsequently modulated by the spreading-sequence signal S$_p^i$(t) that has a sequence period of N$_{cp}$. For N$_{cp}$=N$_{bp}$, the timing relationship between x$_i$(t) and S$_p^i$(t) can be seen in FIGS. 5A–5B. The spreading-sequence signal S$_p^i$(t) contains N$_{cp}$ consecutive nearly random bits each having a duration of T$_{cp}$ (the N$_{cp}$ is called the "period" or "code length" of the corresponding spreading-sequence of the spreading-sequence signal). The output signal of pulse modulator 222, $$x_2(t)=x_1(t)S_p^i(t), \quad (1)$$

is further modulated by carrier modulator 230 with a sinusoidal signal C(t)=√2P sin(ω$_0$t) into a carrier-modulated signal x$_3$(t), where P is the power of C(t). The carrier-modulated signal is then transmitted through a communication channel to its destination.

Refer to FIG. 3B. The transmitted signal is received by the receiver at the receiving end of the channel. In noise free environments, the received signal is y$_1$(t)=Ax$_3$(t−τ$_i$), where "A" is the amplitude of y$_1$(t), and τ$_i$ is the transmission delay of x$_3$(t). The signal y$_1$(t) is demodulated by multiplying it with C(t−τ̂$_i$)=√2sinω$_0$(t−τ̂$_i$), where τ̂$_i$ is an estimate of τ$_i$. Since this description is only to demonstrate the system operation, A=1 and τ̂$_i$=τ$_i$=0 can be assumed without loss of generality. The demodulated signal y$_2$(t) is then multiplied by a locally generated spreading-sequence signal S$_p^i$(t−τ̂$_i$). The waveform of the demodulated signal y$_3$(t) would then be identical to x$_1$(t) at the output of duty-pulse encryptor 221 (in FIG. 3A). However, the absence of noise is only an ideal condition; in practice, the signal y$_3$(t) may be expressed as:

$$y_3(t)=x_1(t)+I(t)+n(t), \quad (2)$$

where I(t) is cross-correlation noise, and n(t) is white noise.

A pair of switches S$_1$ and S$_2$ whose operations are controlled by pulse trains CP$_1$(t) and CP$_2$(t), respectively, are connected to the output of pulse demodulator 232. The waveforms of CP$_1$(t) and CP$_2$(t) are shown in FIGS. 6A–6B. Each square pulse in CP$_1$(t) turns on switch S$_1$, and each square pulse in $CP_2(t)$ turns on switch $S_2$. Matched filters 241 and 242 (integrate-and-dump circuits for the present invention) are respectively connected to switches $S_1$ and $S_2$ such that the signals passing through $S_1$ or $S_2$, denoted by $y_{s1}(t)$ and $y_{s2}(t)$, are processed by matched filters 241 and 242. The signals output from the matched filters are sampled by samplers 251, and 252 and the sampled signals are given by $$z_1(k) = \frac{1}{T} \int_{(k-1)T_{cp}}^{(k-1)T_{cp} + T_s} y_{s1}(t)dt, \quad (3)$$

$$z_2(k) = \frac{1}{T} \int_{(k-1)T_{cp} + T_s}^{kT_{cp}} y_{s2}(t)dt, \quad (4)$$

where $k=1, 2, \ldots, N_{bp}$.

Summers 261 and 262 are used to sum $z_1(k)$ and $z_2(k)$ for $k$ from 1 to $N_{bp}$, respectively, to resulting signals representative of two statistics $A_l$, $l=1$, and 2, $$A_1 = \sum_{k=1}^{N_{bp}} z_1(k), \quad (5)$$

$$A_2 = \sum_{k=1}^{N_{bp}} z_2(k). \quad (6)$$

Define a statistic $\Lambda = |A_1| - |A_2|$, where $|A_l|$ is the absolute value of $A_l$, $l=1$, and 2. Also define two decision bits $d_1$ and $d_2$, where $d_1$ is used to indicate the pulse-position of the $N_{bp}$ duty-pulses within a duty-pulse package received during $2T$, and $d_2$ is used to indicate the polarity of the $N_{bp}$ duty-pulses. Table 3A shows the relationships between $(d_1, d_2)$ and the pulse-position and polarity of the received $N_{bp}$ duty-pulses.

TABLE A3

| Received Duty-Pulses | | Decision Bits |
|---|---|---|
| Pulse-Position | Polarity | $(d_1, d_2)$ |
| $PP_1$ | +1 | (1, 1) |
| $PP_2$ | +1 | (-1, 1) |
| $PP_2$ | -1 | (-1, -1) |
| $PP_1$ | -1 | (1, -1) |

The decision bit $d_1$ is determined according to the following principles:

(1) if $\Lambda \geq 0$, then $d_1=1$, and
(2) if $\Lambda < 0$, then $d_1=-1$.

These principles are implemented in comparator 291 which compares the magnitude of the signal $\Lambda$ with a zero reference voltage. Accordingly, if $\Lambda \geq 0$, then comparator 291 generates a logic high voltage representing a bit "1"; and if $\Lambda < 0$, then comparator 291 generates a logic low voltage representing a bit "-1".

The subsequent step is to determine the decision bit $d_2$, that is, the digit representing the polarity of the $N_{bp}$ duty-pulses within a duty-pulse package received during $2T$. This is implemented in comparator 292 which is connected via switches $S_3$ and $S_4$ to summers 261 and 262. The decision bit $d_1$, determined previously, is used to control the operations of $S_3$ and $S_4$. If $d_1=1$, then $S_3$ is turned ON and $S_4$ is turned OFF allowing only signal $A_1$ to pass to comparator 292. On the other hand, if $d_1=-1$, then $S_3$ is turned OFF and $S_4$ is turned ON allowing only signal $A_2$ to pass to comparator 292.

Comparator 292 compares its input signal with a zero reference voltage. If the input signal is positive going, comparator 292 generates an output bit of $d_2=1$. Conversely, if the input signal is negative going, comparator 292 generates an output bit of $d_2=-1$.

Based on $d_1$ and $d_2$, the bit pattern, $(\hat{b}_{2l}, \hat{b}_{l+1})$, represented by the received $N_{bp}$ duty-pulses can be determined. Recalling Table A2 and Table A3, the relationships between $(\hat{b}_{2l}, \hat{b}_{2l+1})$ and $(d_1, d_2)$ are obtained and given in Table A4:

TABLE A4

| Decision Bits $(d_1, d_2)$ | Deciphered Bit Pattern $(\hat{b}_{2l}, \hat{b}_{2l+1})$ |
|---|---|
| (1, 1) | (1, 1) |
| (-1, 1) | (1, -1) |
| (-1, -1) | (-1, 1) |
| (1, -1) | (-1, -1) |

Logic circuit 295 with $(d_1, d_2)$ as inputs and $(\hat{b}_{2l}, \hat{b}_{2l+1})$ as outputs is devised to implement the logical relationships in Table A4. The design of logic circuit 295 is easy to those skilled in the art of logic circuit design, so that detailed circuit diagram thereof need not be illustrated and described.

Two parallel data bits $\hat{b}_{2l}$ and $\hat{b}_{2l+1}$ are then obtained which are subsequently converted to a serial bit stream by parallel-to-serial converter 296. Thus, parallel-to-serial converter 296 sends out a serial bit stream that is an estimate of the bit stream sent by data source 200 of the transmitter.

FIG. 7 shows a block diagram of another BPSK-BPP-DS-CDMA receiver structure. The integrate-and-dump circuits for matched filters 241 and 242 in this embodiment have integration intervals from 0 to 2T. Therefore, at the outputs of samplers 251 and 252, the same $A_1$ and $A_2$ provided by summers 261 and 262 in the receiver shown in FIG. 3B can be obtained. The rest of this embodiment is the same as that shown in FIG. 3B. Therefore, no further description need be given.

Example 2

A BPSK-QPP-DS-CDMA System (K=3, M=4)

Refer to FIGS. 8A–8B. These show a BPSK-QPP-DS-CDMA (QPP stands for "Quaternary pulse-position") communication system. The transmitter is shown in FIG. 8A, and the receiver is shown in FIG. 8B. Since the system shown in FIGS. 8A–8B contains many components similar in structure to the system shown in FIGS. 3A–3B and previously described in detail, description of the system shown in FIGS. 8A–8B concentrates on differences between the two systems and ignores similarities.

In FIG. 8A, the data bit stream BS is converted by 3-bit serial-to-parallel converter 310 into three parallel bit streams $BS_1$, $BS_2$, and $BS_3$, $$BS_1 = (b_0, b_3, b_6, \ldots, b_{3l}, \ldots), \quad (7)$$

$$BS_2 = (b_1, b_4, b_7, \ldots, b_{3l+1}, \ldots), \quad (8)$$

$$BS_3 = (b_2, b_5, b_8, \ldots, b_{3l+2}, \ldots), \quad (9)$$

with the duration of each bit in $BS_1$, $BS_2$, and $BS_3$ equal to 3T. Consequently, 3-bit serial-to-parallel converter 310 sends out a sequence of 3-bit vectors $(b_{3l}, b_{3l+1}, b_{3l+2})$ $l=0$, 1, 2, ..., to the QPP-DS modulator 320. Each 3-bit vector thus formed is a bit pattern of the eight possible bit patterns listed in Table B1.

TABLE B1

| $(b_{3l}, b_{3l+1}, b_{3l+2})$ |
| --- |
| (1, 1, 1) |
| (1, 1, −1) |
| (1, −1, 1) |
| (1, −1, −1) |
| (−1, 1, 1) |
| (−1, 1, −1) |
| (−1, −1, 1) |
| (−1, −1, −1) |

Refer to FIGS. 9A–9H. A number $N_{bp}$ is selected to divide each duration 3T into $N_{bp}$ equal intervals. Each interval has a duration $T_{cp}$, $T_{cp} = 3T/N_{bp}$. This time duration $T_{cp}$ is also used as the chip duration of the spreading-sequence signal $S_p^i(t)$ used by the transmitter shown in FIG. 8A. Each $T_{cp}$ is further divided into four pulse-positions with each pulse-position having a duration of $T_s$, $T_s = T_{cp}/4$. The four pulse-positions are denoted $PP_1$, $PP_2$, $PP_3$, and $PP_4$.

A mapping table that defines the generation of a duty-pulse package at the output of duty-pulse encryptor 321 in response to the input 3-bit vector from the output of 3-bit S-P converter 310 is predefined to have the following mapping relationships:

(a) if the 3-bit vector is (1, 1, 1), then duty-pulse encryptor 321 sends out a package of $N_{bp}$ consecutive positive square pulses (hereinafter referred to as "duty-pulses") during bit duration 3T, with each duty-pulse appearing at pulse-position $PP_1$;

(b) if the 3-bit vector is (1, 1, −1), then duty-pulse encryptor 321 sends out a package of $N_{bp}$ consecutive positive duty-pulses during bit duration 3T, with each duty-pulse appearing at pulse-position $PP_2$;

(c) if the 3-bit vector is (1, −1, 1), then duty-pulse encryptor 321 sends out a package of $N_{bp}$ consecutive positive duty-pulses during bit duration 3T, with each duty-pulse appearing at pulse-position $PP_3$;

(d) if the 3-bit vector is (1, −1, −1), then duty-pulse encryptor 321 sends out a package of $N_{bp}$ consecutive positive duty-pulses during bit duration 3T, with each duty-pulse appearing at pulse-position $PP_4$;

(e) if the 3-bit vector is (−1, 1, 1), then duty-pulse encryptor 821 sends out a package of $N_{bp}$ consecutive negative duty-pulses during bit duration 3T, with each duty-pulse appearing at pulse-position $PP_4$;

(f) if the 3-bit vector is (−1, 1, −1), then duty-pulse encryptor 321 sends out a package of $N_{bp}$ consecutive negative duty-pulses during bit duration 3T, with each duty-pulse appearing at pulse-position $PP_3$;

(g) if the 3-bit vector is (−1, −1, 1), then duty-pulse encryptor 321 sends out a package of $N_{bp}$ consecutive negative duty-pulses during bit duration 3T, with each duty-pulse appearing at pulse-position $PP_2$; and (h) if the 3-bit vector is (−1, −1, −1), then duty-pulse encryptor 321 sends out a package of $N_{bp}$ consecutive negative duty-pulses during bit duration 3T, with each duty-pulse appearing at pulse-position $PP_1$.

These mapping relationships are presented in Table B2, and illustrated in FIGS. 9A–9H.

TABLE B2

| Bit Pattern | Encrypted Duty-Pulses | |
| --- | --- | --- |
| $(b_{3l}, b_{3l+1}, b_{3l+2})$ | Pulse-Position | Polarity |
| (1, 1, 1) | $PP_1$ | +1 |
| (1, 1, −1) | $PP_2$ | +1 |
| (1, −1, 1) | $PP_3$ | +1 |
| (1, −1, −1) | $PP_4$ | +1 |
| (−1, 1, 1) | $PP_4$ | −1 |
| (−1, 1, −1) | $PP_3$ | −1 |
| (−1, −1, 1) | $PP_2$ | −1 |
| (−1, −1, −1) | $PP_1$ | −1 |

Table B2 shows only a preferred example of the mapping relationships. Each bit pattern can be assigned by a one-to-one mapping relationship to any of the eight possible duty-pulse package patterns. Therefore, there are 8!=40320 possible mapping tables making it extremely difficult for eavesdroppers to decipher the encrypted duty-pulses.

For example, if the leading twelve bits in the bit stream BS are 1−11, −1−1−1, 1−1−1, 111, then duty-pulse encryptor 321 will send out the duty-pulse train $x_1(t)$ shown in FIG. 10A.

The duty-pulse train $x_1(t)$ is then modulated by pulse modulator 322 with a spreading-sequence signal $S_p^i(t)$ that has chip duration $T_{cp}$. For the case that $N_{cp} = N_{bp}$, the timing relationship between $x_1(t)$ and $S_p^i(t)$ can be seen in FIGS. 10A–10B. The resultant signal $x_2(t)$, $x_2(t) = x_1(t)S_p^i(t)$, is then further modulated with $C(t) = \sqrt{8P/3}\sin(\omega_o t)$ and the carrier-modulated signal $x_3(t)$ is transmitted through a communication channel to its destination.

Refer to FIG. 8B. The receiver contains carrier demodulator 331 and pulse demodulator 332 at the front end, followed by an array of four switches $S_1$, $S_2$, $S_3$, and $S_4$, which are coupled respectively to an array of four matched filters 341, 342, 343, and 344, and in turn an array of four samplers 351, 352, 353, and 354, and in turn to an array of four summers 361, 362, 363, and 364. The operations of switches $S_1$, $S_2$, $S_3$, and $S_4$ are controlled by pulse trains $CP_1(t)$, $CP_2(t)$, $CP_3(t)$, and $CP_4(t)$, shown in FIGS. 11A–11D, such that for the duration of pulse-position $PP_1$, $S_1$=ON and $S_2=S_3=S_4$=OFF;

for the duration of pulse-position $PP_2$, $S_2$=ON and $S_1=S_3=S_4$=OFF;

for the duration of pulse-position $PP_3$, $S_3$=ON and $S_1=S_2=S_4$=OFF; and for the duration of pulse-position $PP_4$, $S_4$=ON and $S_1=S_2=S_3$=OFF.

The signals passed by switches $S_1$, $S_2$, $S_3$, and $S_4$, denoted by $y_{s1}(t)$, $y_{s2}(t)$, $y_{s3}(t)$, and $y_{s4}(t)$, respectively, are processed by matched filters 341, 342, 343, and 344. The signals output from the matched filters are sampled by samplers 351, 352, 353, and 354, and the sampled signals are given by $$z_1(k) = \frac{4}{3T} \int_{(k-1)T_{cp}}^{(k-1)T_{cp}+T_s} y_{s1}(t)dt, \quad (10)$$

$$z_2(k) = \frac{4}{3T} \int_{(k-1)T_{cp}+T_s}^{(k-1)T_{cp}+2T_s} y_{s2}(t)dt, \quad (11)$$

-continued $$z_3(k) = \frac{4}{3T} \int_{(k-1)T_{cp}+2T_s}^{(k-2)T_{cp}+3T_s} y_{s3}(t)dt, \quad (12)$$

$$z_4(k) = \frac{4}{3T} \int_{(k-1)T_{cp}+3T_s}^{kT_{cp}} y_{s4}(t)dt. \quad (13)$$

These $z_1(k)$, $z_2(k)$, $z_3(k)$, and $z_4(k)$ are added for k from 1 to $N_{bp}$ by summers 361, 362, 363, and 364, respectively, to obtain four signals representative of the four statistics $\Lambda_1$, $\Lambda_2$, $\Lambda_3$, and $\Lambda_4$:

$$\Lambda_1 = \sum_{k=1}^{N_{bp}} z_1(k), \quad (14)$$

$$\Lambda_2 = \sum_{k=1}^{N_{bp}} z_2(k), \quad (15)$$

$$\Lambda_3 = \sum_{k=1}^{N_{bp}} z_3(k), \quad (16)$$

$$\Lambda_4 = \sum_{k=1}^{N_{bp}} z_4(k). \quad (17)$$

An array of four absolute value generators 371, 372, 373, and 374 is used to generate the absolute values of the four statistics $\Lambda_1$, $\Lambda_2$, $\Lambda_3$, and $\Lambda_4$. The absolute values $|\Lambda_1|$, $|\Lambda_2|$, $|\Lambda_3|$, and $|\tau_{94}|$ are compared with one another in magnitude comparator 381 to determine which one has the largest value. If $|\Lambda_j|$ has the largest value, it indicates that each pulse of the $N_{bp}$ duty pulses within a duty-pulse package received is located at $PP_j$. Magnitude comparator 381 has four output bits $d_1$, $d_2$, $d_3$, and $d_4$ (the use of four output bits is just for presentation convenience, actually two output bits is sufficient to indicate the results) to indicate which statistic has the largest absolute value. The values of these bits are assigned according to the following principles:

if $|\Lambda_1|$ is largest, then $d_1=1$, $d_2=-1$, $d_3=-1$, $d_4=-1$;

if $|\Lambda_2|$ is largest, then $d_1=-1$, $d_2=1$, $d_3=-1$, $d_4=-1$;

if $|\Lambda_3|$ is largest, then $d_1=-1$, $d_2=-1$, $d_3=1$, $d_4=-1$; and if $|\Lambda_4|$ is largest, then $d_1=-1$, $d_2=-1$, $d_3=-1$, $d_4=1$.

The outputs of summers 361, 362, 363, and 364 are also connected to switch circuit 390 which is controlled by $d_1$, $d_2$, $d_3$, and $d_4$ such that if $d_1=1$ and $d_2=d_3=d_4=-1$, $\Lambda_1$ is passed as an output, if $d_2=1$ and $d_1=d_3=d_4=-1$, $\Lambda_2$ is passed as an output, if $d_3=1$ and $d_1=d_2=d_4=-1$, $\Lambda_3$ is passed as an output, and if $d_4=1$ and $d_1=d_2=d_3=-1$, $\Lambda_4$ is passed as an output.

As a result, only the statistic that has the largest absolute value among the four statistics is selected to pass through switch circuit 390 and is denoted $\Lambda_p$. $\Lambda_p$ is then compared by comparator 382 to determine the polarity of the pulses within the duty-pulse package received. The output of comparator 382 is the polarity decision bit $d_p$, where $d_p=1$ if $\Lambda_p \geq 0$, i.e., the input signal has a positive magnitude, and $d_p=-1$ if $\Lambda_p<0$, i.e., the input signal has a negative magnitude.

The relationships among decision bit patterns $(d_1, d_2, d_3, d_4, d_p)$ and the pulse-positions and polarities of $N_{bp}$ duty-pulses received are listed in Table B3:

TABLE B3

| Received Duty-Pulses | | Decision Bit pattern |
|---|---|---|
| Pulse-Position | Polarity | $(d_1, d_2, d_3, d_4, d_p)$ |
| $PP_1$ | +1 | (1, -1, -1, -1, 1) |
| $PP_2$ | +1 | (-1, 1, -1, -1, 1) |
| $PP_3$ | +1 | (-1, -1, 1, -1, 1) |
| $PP_4$ | +1 | (-1, -1, -1, 1, 1) |
| $PP_4$ | -1 | (-1, -1, -1, 1, -1) |
| $PP_3$ | -1 | (-1, -1, 1, -1, -1) |
| $PP_2$ | -1 | (-1, 1, -1, -1, -1) |
| $PP_1$ | -1 | (1, -1, -1, -1, -1) |

In accordance with the relationships defined in Table B2 and Table B3, the bit pattern represented by the $N_{bp}$ duty-pulses of the duty-pulse package received can be determined after the five decision bits $d_1$, $d_2$, $d_3$, $d_4$, and $d_p$ are determined. These relationships are listed in Table B4:

TABLE B4

| Decision Bits $(d_1, d_2, d_3, d_4, d_p)$ | Deciphered Bit Patterns $(b_{3l}, b_{3l+1}, b_{3l+2})$ |
|---|---|
| (1, -1, -1, -1, 1) | (1, 1, 1) |
| (-1, 1, -1, -1, 1) | (1, 1, -1) |
| (-1, -1, 1, -1, 1) | (1, -1, 1) |
| (-1, -1, -1, 1, 1) | (1, -1, -1) |
| (-1, -1, -1, 1, -1) | (-1, 1, 1) |
| (-1, -1, 1, -1, -1) | (-1, 1, -1) |
| (-1, 1, -1, -1, -1) | (-1, -1, 1) |
| (1, -1, -1, -1, -1) | (-1, -1, -1) |

Logic circuit 401 constructs the truth table for Table B4. The three parallel output bits of logic circuit 401 are converted into a serial bit sequence by parallel-to-serial converter 402 such that the estimate of the data bit stream originally sent out from data source 300 (in the transmitter) is obtained.

FIG. 12 shows a Type 2 embodiment of the BPSK-QPP-DS-CDMA receiver. In this embodiment, switches $S_{11}$ and $S_{12}$ are controlled by the pulse trains $CP_{11}(t)$ and $CP_{12}(t)$ shown in FIGS. 13A-13B, respectively, and switches $S_{21}$, $S_{22}$, $S_{23}$, and $S_{24}$ are controlled respectively by the pulse trains $CP_{21}(t)$, $CP_{22}(t)$, $CP_{23}(t)$, and $CP_{24}(t)$ shown in FIGS. 13C-13F such that $S_{11}$=ON and $S_{12}$=OFF for $nT_s \leq t<(n+1)T_s$, $S_{11}$=OFF and $S_{12}$=ON for $(n+1)T_s \leq t<(n+2)T_s$, $S_{21}$=ON and $S_{22}=S_{23}=S_{24}$=OFF for $nT_{cp} \leq t<nT_{cp}+T_s$, $S_{22}$=ON and $S_{21}=S_{23}=S_{24}$=OFF for $nT_{cp}+T_s \leq t<nT_{cp}+2T_s$, $S_{23}$=ON and $S_{21}=S_{22}=S_{24}$=OFF for $nT_{cp}+2T_s \leq t<nT_{cp}+3T_s$, and $S_{24}$=ON and $S_{21}=S_{22}=S_{23}$=OFF for $nT_{cp}+3T_s \leq t<nT_{cp}+4T_s$, where n=0, 1, 2, . . . Those skilled in the art can easily see that this Type 2 embodiment of the BPSK-QPP-DS-CDMA receiver has the same function as the BPSK-QPP-DS-CDMA receiver shown in FIG. 8B. Thus, a detailed description of the operations of this embodiment need not be given.

FIG. 14 shows a block diagram of a Type 3 embodiment of the BPSK-QPP-DS-CDMA receiver. In this embodiment, matched filters 341, 342, 343, and 344 are integrate-and-dump circuits having integration intervals from 0 to 3T. Therefore, at the outputs of samplers 351, 352, 353, and 354, the same $\Lambda_1$, $\Lambda_2$, $\Lambda_3$ and $\Lambda_4$ provided by the summers in the receiver shown in FIG. 8B can be obtained.

A BPSK-MPP-DS-CDMA System

An M-ary system of the present invention is shown in FIGS. 15A–15B and is called a BPSK-MPP-DS-CDMA system. The transmitter is shown in FIG. 15A and the receiver is shown in FIG. 15B. Since the basic M-ary system structure is the same for all values of M, only those components that depend on the value of M selected need be described in detail.

Refer to FIG. 15A. A serial data bit stream is converted by K-bit serial-to-parallel converter 910 into K parallel bit streams, or in other words into a sequence of K-bit vectors with the time duration of each K-bit vector equal to KT. As shown in FIG. 16A, an integer $N_{bp}$ is selected to divide each duration KT into $N_{bp}$ equal intervals with interval durations equal to $T_{cp}$, $T_{cp}=KT/N_{bp}$. Each $T_{cp}$ is further divided into M pulse-positions with each pulse-position having a duration of $T_s$ (see FIG. 16B), where $T_s=T_{cp}/M$ and $M=2^{K-1}$. The M pulse-positions are designated $PP_l$, $l=1, 2, \ldots, M$. Since each pulse-position can accommodate either a positive pulse or a negative pulse, there are 2M possible duty-pulse package patterns. So that a one-to-one mapping relationship can be established between the 2M possible bit patterns of a K-bit vector and the 2M possible duty-pulse package patterns.

Refer to FIG. 15B. The M-ary system receiver is structurally similar to the receiver shown in FIG. 8B except that M components (instead of four), such as switches, matched filters, samplers, summers, and absolute-value generators, may be used.

The demodulated signal $y_3(t)$ is demultiplexed into M parallel pulse streams by an array of M switches which are respectively triggered ON by $CP_l(t)$, $l=1, 2, \ldots, M$, for durations of $T_s$ in periods of $T_{cp}$, and then passed to an array of M matched filters 940, an array of M samplers 950, an array of M summers 960, and an array of M absolute-value generators 970. Functional operations of each component in each array are similar to those shown in FIG. 8B and described previously.

FIG. 17A shows a Type 2 embodiment of the BPSK-MPP-DS-CDMA receiver. Functional operations of each component in this embodiment is similar to that given for the receiver shown in FIG. 12, so that detailed descriptions of this embodiment need not be given.

FIG. 17B shows a block diagram of a Type 3 embodiment of the BPSK-MPP-DS-CDMA receiver. In this embodiment, matched-filter array 940 includes M integrate-and-dump circuits having integration intervals from 0 to KT. Therefore, at the outputs of sampler array 950, the same $A_l$, $l=1, 2, \ldots, M$ provided by summer array 960 in the receiver shown in FIG. 15B can be obtained.

Performance Evaluations

Assuming that the amount of energy for making one decision in the BPSK-DS-CDMA or BPSK-MPP-DS-CDMA system is equal to PT, it is shown that the BPSK-MPP-DS-CDMA system of the present invention provides at least three improved characteristics over conventional BPSK-DS-CDMA systems:

(1) it reduces the power of cross-correlation noise,
(2) it increases multiple-access capacity, and
(3) it requires reduced transmission energy.

The power of cross-correlation noise is reduced by a factor of K, $K=Log_2M+1$ and M is the number of pulse-positions selected for the present invention system.

Under same bandwidth and same bit error rate comparison conditions, if multiple access capacity is not limited by the number $N_u$ of available sequence signals in the spreading-sequence signal set $\{S_p(t)\}$, then multiple access capacity is improved by a factor of at least:

1 if the system is based on K=2,
1.335 if the system is based on K=3,
1.66 if the system is based on K=4,
1.65 if the system is based on K=5.

Conversely, if multiple access capacity is limited by $N_u$, i.e., when the number of users has reached $N_u$, the reduced cross-correlation noise power still reduces the system bit error rate.

The transmission energy required by the BPSK-MPP-DS-CDMA system is only 1/K of the transmission energy required by conventional BPSK-DS-CDMA systems, and thus (K−1)/K of the transmission energy is saved.

Figure 1A:
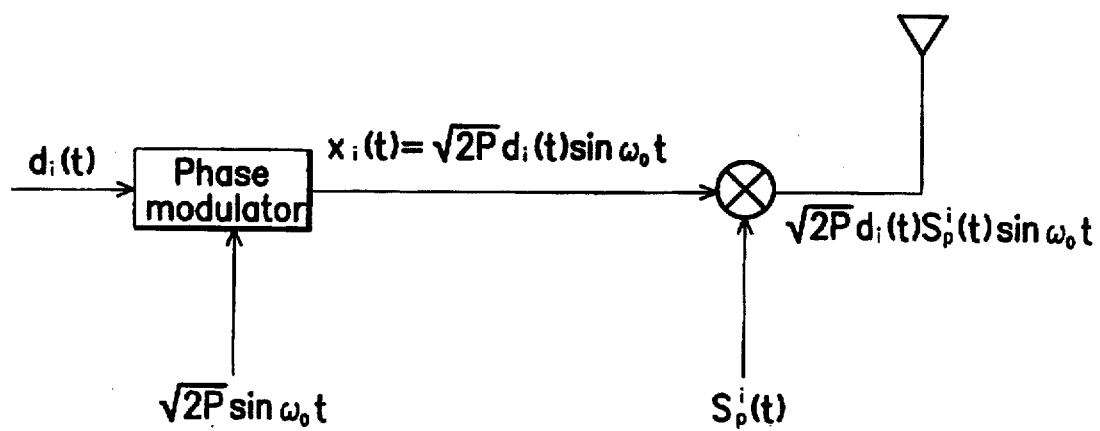
FIG. 1A shows a block diagram of a conventional BPSK direct sequence spread spectrum system transmitter.
Figure 1B:
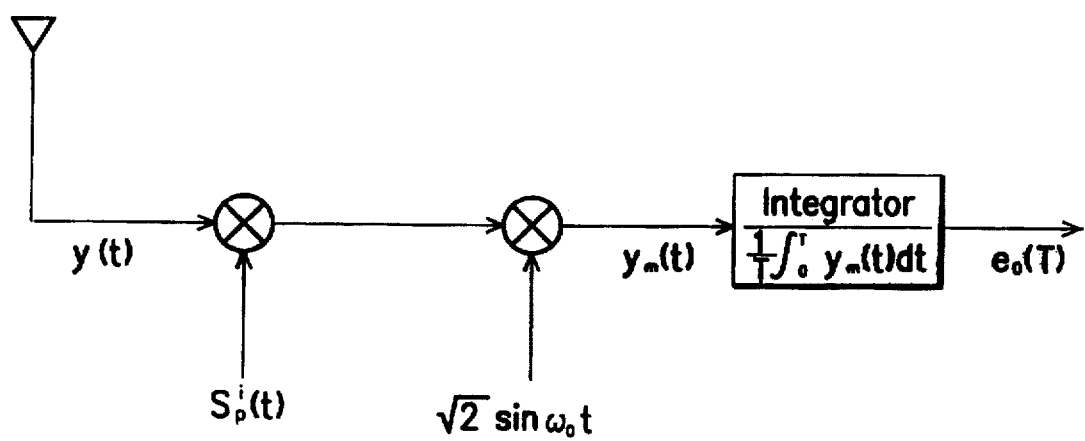
FIG. 1B shows a block diagram of a conventional BPSK direct sequence spread spectrum system receiver.
Figure 2:
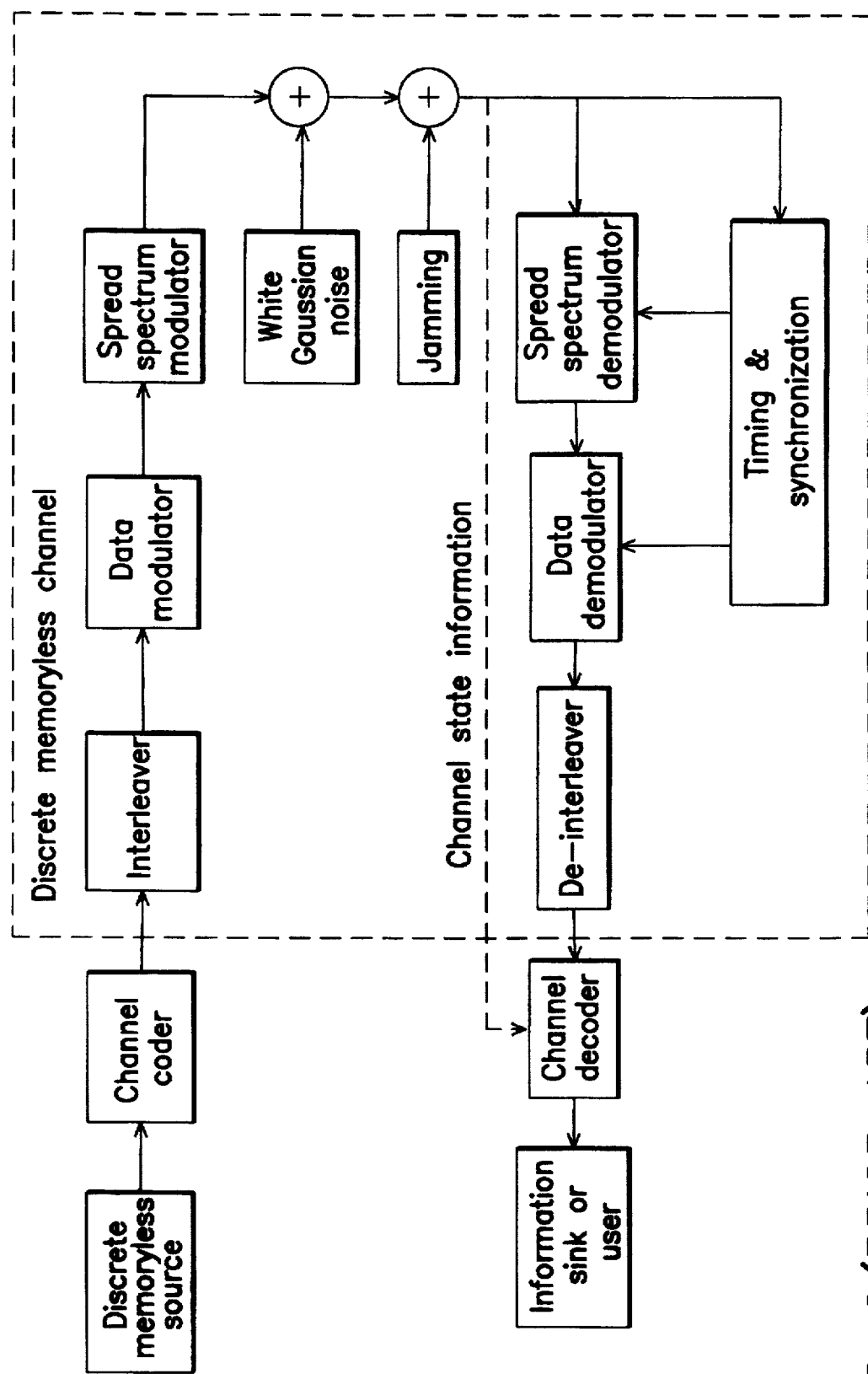
FIG. 2 shows a basic CDMA communication system model.

These improved characteristics are derived by theoretical evaluations using mathematical analyses. The results of theoretical evaluations of the conventional BPSK-DS-CDMA system shown in FIGS. 1A–1B are briefly summarized. The results are then used as the comparision basis of the theoretical evaluations of the present invention systems.

In the following evaluations, we make four assumptions:

(1) J users are present in the communication channel and every user's transmitted signal carries equal power P;

(2) the communication channel does not attenuate the power of the transmitted signal;

(3) coherent demodulation is employed in the BPSK-MPP-DS-CDMA system receiver; and (4) A pseudorandom sequence signal $PN_p^i(t)$, which has a sequence period $N_{cp}$ equal to $N_{bp}$ and a chip duration equal to $T_{cp}$, is used as the spreading-sequence signal for the BPSK-MPP-DS-CDMA system.

These four assumptions are commonly made in academic literature and are also employed in the following analyses.

(1) Performance Evaluation of the Conventional BPSK-DS-CDMA System

FIGS. 1A–1B show a conventional BPSK-DS-CDMA system. The spreading-sequence signal $S_p^i(t)$ used by the system shown in FIGS. 1A–1B is assumed to be a pseudorandom sequence signal $P_i(t)$ having a chip duration of $T_c$ and a period of $N_c$. This $PN_i(t)$ is the signature of the i-th user and is used by the transmitter shown in FIG. 1A to modulate the signal $x_i(t)$. It is also used by the receiver shown in FIG. 1B to demodulate the received signal $y(t)$. For the case where J users are present in the channel and each user's transmitted signal carries equal power P, the received signal can be represented as $$y(t) = \sum_{j=1}^{J} \sqrt{2P}\, d_j(t-\tau_j)PN_j(t-\tau_j)\sin[\omega_0(t-\tau_j)+\phi_j]+n(t), \quad (18)$$

where $d_j(t)$ is a data sequence having a bit duration of T, $\tau_j$ is the transmission delay, $\phi_j$ is the random phase of the j-th transmitter, and n(t) is additive white Gaussian noise. Since only relative time delays and phase angles need be considered, $\phi_i$ and $\tau_i$ of the i-th transmitter can be assumed to be zero, i.e., $\phi_i=0$ and $\tau_i=0$.

Assuming coherent demodulation, the signal at the input of the matched filter (the integrator in FIG. 1B) of the i-th receiver is given by $$y_m(t) = \sqrt{P}\ d_i(t) + \sum_{j=1, j\neq i}^{J} \sqrt{P}\ d_j(t-\tau_j)PN_i(t)PN_j(t-\tau_j) \times \quad (19)$$

$$\cos(\omega_0\tau_j - \phi_j) + n(t)\sqrt{2}\ PN_i(t)\sin(\omega_0 t)$$

$$= \sqrt{P}\ d_i(t) + N_j(t) + n'(t),$$

where $\sqrt{P}d_i(t)$ is the desired signal and $N_j(t)$ is the cross-correlation noise (CCN). The $2\omega_0$ terms are omitted in the above equation since they will be filtered out by the matched filter that follows.

Since $\omega_0\tau_j$ and $\phi_j$ in Eq.(19) are uniformly distributed over $(0, 2\pi)$, $\omega_0\tau_j$ can be included in $\phi_j$. Based on random NRZ code symbol and from pertinent reference [4], the power spectral density (psd) around f=0 of the CCN due to the j-th transmitted signal, i.e., $\sqrt{P}d_j(t-\tau_j)PN_i(t)PN_j(t-\tau_j)\cos\phi_j$ is derived to be equal to $PT_c/3$. Therefore, the two-sided psd of the CCN around f=0 is given by $$\frac{N_J}{2} = \sum_{j=1, j\neq i}^{J} \frac{1}{3} PT_c = \frac{1}{3}(J-1)PT_c. \quad (20)$$

This result was also derived by Pursley and given in pertinent reference [8].

In pertinent reference [5], Yao proved that the probability density function (pdf) of $N_j(t)$ is approximately Gaussian when the number of users is sufficiently large. This result is also justified in pertinent reference [6]. Let $N_0/2$ be the two-sided psd of n(t) and neglect the spreading effect of $PN_i(t)$ on n(t), the signal-to-noise ratio is then $$SNR = \frac{2PT}{\frac{2}{3}(J-1)PT_c + N_0}. \quad (21)$$

For $2(J-1)PT_c/3 \gg N_0$, we have $$SNR = \frac{2PT}{\frac{2}{3}(J-1)PT_c} = \frac{3T}{(J-1)T_c}. \quad (22)$$

Consequently the bit error rate of the receiver can be derived as $$P_b = Q\left(\sqrt{\frac{2E_b}{\frac{2}{3}(J-1)PT_c + N_0}}\right) = \quad (23)$$

$$Q\left(\sqrt{\frac{2PT}{\frac{2}{3}(J-1)PT_c + N_0}}\right),$$

where $E_b=PT$ is the bit energy of $d_i(t)$ and Q(x) is the Q-function. Note that the bit energy $E_b$ is the energy used for deciding whether the bit of the transmitted di(t) is 1 or −1 and thus $E_b$ is also defined as the "energy used for one decision".

(2) Performance Evaluation of the BPSK-BPP-DS-CDMA System of the Present Invention (K=2; M=2)

FIGS. 3A–3B show the BPSK-BPP-DS-CDMA system. The spreading-sequence signal $S_p^i(t)$ used by the system shown in FIGS. 3A–3B is assumed to be a pseudorandom sequence signal $PN_p^i(t)$ which has a period $N_{cp}$ equal to $N_{bp}$ and a chip duration of $T_{cp}$. The index p is used to distinguish the pseudorandom sequence signal $PN_p^i(t)$ from the pseudorandom sequence signal $PN_i(t)$ used in the conventional BPSK-DS-CDMA system shown in FIGS. 1A–1B. The $PN_p^i(t)$ is the signature of the i-th user. In FIG. 3A, the binary data signal $d_i(t)$ is converted by the serial-to-parallel converter 210 into two parallel data sequences $$d_{i1}(t) = \sum_{l=-\infty}^{\infty} b_{2l}P_{2T}(t-2lT) \quad (24)$$

and $$d_{i2}(t) = \sum_{l=-\infty}^{\infty} b_{2l+1}P_{2T}(t-2lT), \quad (25)$$

where $P_{2T}(t)$ has duration 2T. For convenience, we omitted the index i in $b_{2l}$ and $b_{2l+1}$. For purposes of comparison, the bandwidths used for the conventional BPSK-DS-CDMA and BPSK-BPP-DS-CDMA systems are assumed to be the same. Also, the amount of energy used for one decision in each system is assumed to be equal to PT. The transmitted signal $x_3(t)$ in FIG. 3A can then be written as $$x_3(t) = \sqrt{2P}\ PN_c^i(t)\sin\omega_0 t, \quad (26)$$

where $\omega_0$ is the carrier frequency and $$PN_c^i(t) = \left\{\sum_{l=-\infty}^{\infty}\sum_{k=1}^{N_{cp}} d_l^i P_u^m[t-(k-1)T_{cp}-2lT]P_{2T}(t-2lT)\right\} PN_p^i(t), \quad (27)$$

where $d_l^i \in \{1,-1\}$ and $$P_u^m(t) = \begin{cases} 1 & (m-1)T_s < t \leq mT_s \\ 0 & \text{otherwise,} \end{cases} \quad (28)$$

and m equals 1 or 2 depending on the vector $(b_{2l}, b_{2l+1})$. This dependence can be seen in FIGS. 4A–4D. Since $b_{2l}, b_{2l+1} \in \{1, -1\}$, $PN_c^i(t)$ has four possible duty-pulse package patterns, $PN_{cn}^i(t)$, n=1, 2, 3, and 4 in each [0, 2T] interval. These patterns can be visualized as obtained by multiplying the waveforms shown in FIGS. 4A–4D with $PN_p^i(t)$.

For the case where J users are present in the channel, the received signal can then be represented as $$y_1(t) = \sum_{j=1}^{J} \sqrt{2P}\ PN_c^j(t-\tau_j)\sin[\omega_0(t-\tau_j)+\phi_j] + n(t). \quad (29)$$

In FIGS. 4A–4D, we can see that the pulses within a duty-pulse package can be present only in $PP_1$ or $PP_2$. Thus we define two hypotheses $H_1$: the pulses are present in $PP_1$;
$H_2$: the pulses are present in $PP_2$.

The two statistics $\Lambda_1$ and $\Lambda_2$ at the outputs of summers 261 and 262 in FIG. 3B under hypotheses $H_1$ and $H_2$ are then given by $$H_1: \quad \Lambda_1 = \pm\sqrt{P} + I_1 + \eta_1; \quad \Lambda_2 = I_2 + \eta_2 \quad (30)$$

$$H_2: \quad \Lambda_1 = I_1 + \eta_1; \quad \Lambda_2 = \pm\sqrt{P} + I_2 + \eta_2,$$

where the polarity of $\sqrt{P}$ is determined by the polarity of the $N_{cp}$ duty-pulses within the duty-pulse package received. $I_1$, $I_2$, $\eta_1$, and $\eta_2$ and white noise produced terms in $PP_1$ and $PP_2$, respectively. The output of summer 280 is $\Lambda=|\Lambda_1|-|\Lambda_2|$. The decision rule for comparator 291 is $$d_1 = \begin{cases} +1 & \text{if } \Lambda \geq 0 \\ -1 & \text{if } \Lambda < 0. \end{cases} \quad (31)$$

The operations of switches $S_3$ and $S_4$ are controlled by $d_1$ as follows:

1. $S_3$ on and $S_4$ off if $d_1=1$.
2. $S_3$ off and $S_4$ on if $d_1=-1$.

As a consequence, the signal at the input of comparator 292 is $$A_p = \begin{cases} \Lambda_1 & \text{if } d_1 = 1 \\ \Lambda_2 & \text{if } d_2 = -1. \end{cases} \quad (32)$$

Then the decision rule for comparator 202 is given by $$d_2 = \begin{cases} 1 & \text{if } \Lambda_p \geq 0 \\ -1 & \text{if } \Lambda_p < 0. \end{cases} \quad (33)$$

As a result, the estimate $(\hat{b}_{2l}, \hat{b}_{2l+1})$ or $(b_{2l}, b_{2l+1})$ can be obtained from Table A4.

2.1 The Power Spectral Densities Associated with the Transmitted Waveforms

From FIGS. 4A–4D, we can see that the duty pulses are present only in $PP_1$ or $PP_2$ and that $PN_{c3}{}^i(t) = -PN_{c2}{}^i(t)$ and $PN_{c4}{}^i(t) = -PN_{c1}{}^i(t)$. By using these properties and modeling $PN_p{}^i(t)$ as a random process, the psd of $PN_c{}^i(t)$ can then be derived as $$S_s(f) = \frac{T_s}{2} \text{sinc}^2(\pi f T_s). \quad (34)$$

From pertinent reference [4], the psd of a long direct sequence signal $PN_c(t)$ is given by $$S_{PN}(f) = T_c \sin c^2(\pi f T_c). \quad (35)$$

Thus, for $T_s = T_c$, the bandwidths of BPSK-DS-CDMA and BPSK-BPP-DS-CDMA are equal and $S_s(f) = S_{PN}(f)/2$.

Figure 19A:
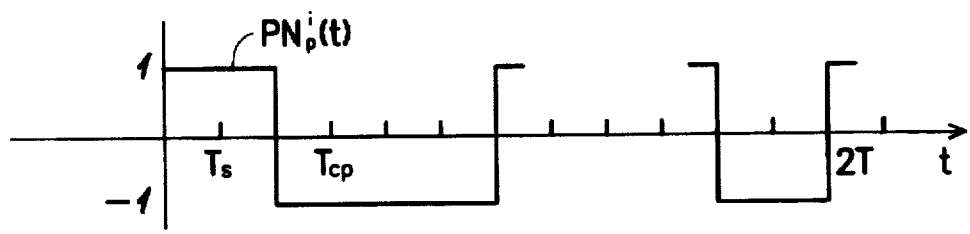
Figure 19B:
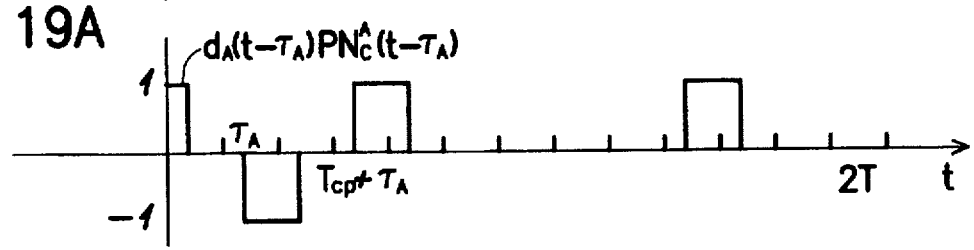
Figure 19C:
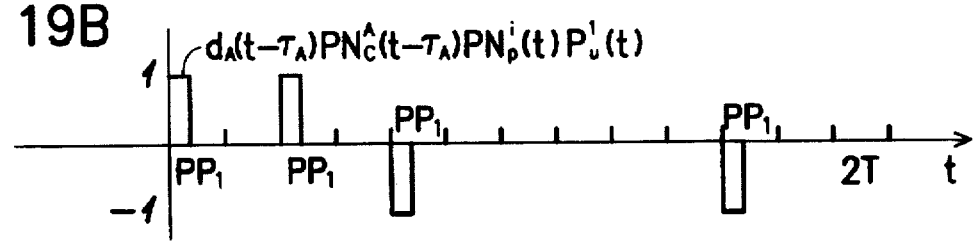
Figure 19D:
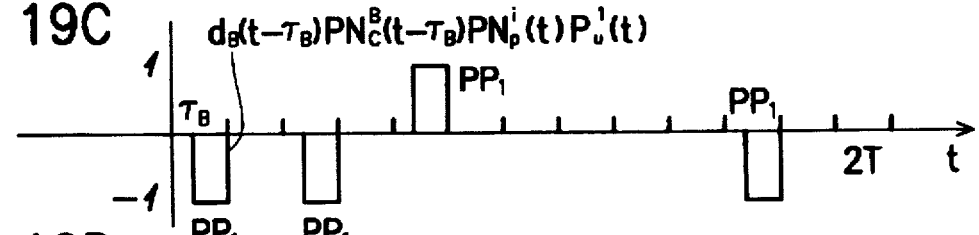

In order to discuss the influence of $I_1$ and $I_2$ on the bit error rate of the BPSK-BPP-DS-CDMA system, we need to derive the psd of $\sqrt{P}d_j(t-\tau_j)PN_c{}^j(t-\tau_j)PN_p{}^i(t)P_u{}^m(t)\cos\phi_j$. FIGS. 18A–18C show an example of the CCN due to the j-th user's transmitted signal in the conventional BPSK-DS-CDMA system shown in FIGS. 1A–1B. In FIGS. 19C–19D, we show two CCNs due to users A's and B's transmitted signals in pulse-position $PP_1$ for the i-th receiver of the BPSK-BPP-DS-CDMA system, respectively. For $\tau_A = T_s + \tau_j$ and $\tau_B = \tau_j$, the two waveforms of CCNs in $PP_1$ shown in FIGS. 19C–19D are plotted purposely such that they can be considered as decomposed from the CCN shown in FIG. 18C. Actually, the pulses in the three CCNs are all nearly independent pulses. Therefore, the polarities of pulses in the CCNs shown in FIGS. 19C–19D are not necessary consistent with the polarities of pulses shown in FIG. 18C, respectively. Since the transmission delay $\tau_j$ is uniformly distributed over $(0, T_{cp})$ and thus the decomposing process mentioned above can always be performed, the power of the CCN produced by two users' transmitted signals in $PP_1$ of the BPSK-BPP-DS-CDMA system receiver equals the power of the CCN produced by a single user's transmitted signal in the BPSK-DS-CDMA receiver. Clearly, the characteristics of CCN in $PP_1$ and $PP_2$ are the same. Since the power of CCN is proportional to the number of users and since the amplitude of the transmitted duty-pulse is $\sqrt{2P}$, the psd around $f=0$ of the CCN in $PP_1$ and $PP_2$ of the BPSK-BPP-DS-CDMA receiver is given by $$\frac{N_{I}P}{2} = \frac{1}{2}\left[\frac{1}{3}(J-1)PT_s\right]. \quad (36)$$

We next investigate the characteristics of $\eta_1$ and $\eta_2$. For the worst case, $\eta_1$ and $\eta_2$ can be considered as two random variables produced by filtering white noise, which has two-sided psd of $N_0/2$, with two ideal low-pass filters having bandwidth of $1/T$.

Let $N_I/2$ denote the two-sided psd of the total interference noise at the inputs of matched filters 241, and 242, then $$\frac{N_I}{2} = \frac{1}{2}\left[\frac{1}{3}(J-1)PT_s\right] + \frac{N_0}{2}. \quad (37)$$

2.2 The Signal-to-Noise Ratio of the BPSK-BPP-DS-CDMA System

From Eq.(37), the signal-to-noise ratios at the outputs of summers 261 and 262 of the BPSK-BPP-DS-CDMA system were calculated and given by $$SNR = \frac{2PT}{\frac{1}{2}\left[\frac{2}{3}(J-1)PT_s\right] + N_0}. \quad (38)$$

For $(J-1)PT_s/3 \gg N_0$, we have $$SNR = \frac{2PT}{\frac{1}{2}\left[\frac{2}{3}(J-1)PT_s\right]}. \quad (39)$$

Comparing Eq.(39) with Eq.(22), that is comparing the SNR of the BPSK-BPP-DS-CDMA system with the SNR of conventional BPSK-DS-CDMA systems, we can see that the SNR is improved by a factor of 2.

2.3 Bit Error rate of the BPSK-BPP-DS-CDMA System

By considering the hypothesis testing of $H_1$ against $H_2$, it was shown that the error rate $P_{e1}$ of comparator 291 satisfies $$P_{e1} < UP_{e1}, \quad (40)$$

where $$UP_{e1} = 2Q\left(\frac{\sqrt{P}}{\sqrt{2}\,\sigma_1}\right) \quad (41)$$

and $\tau_l = (N_I/2T)^{0.5}$. Note that $N_I/2$ is given in Eq.(37).

To discuss the error rate of comparator 292, we assume that $b_{2l} = 1$ is transmitted. From Table A4, we know that $\hat{b}_{2l} = 1$ occurs when $\{d_1 = 1, d_2 = 1\}$ or $\{d_1 = -1, d_2 = 1\}$. Therefore, $$\begin{aligned} P\{\hat{b}_{2l} = 1/b_{2l} = 1\} &= P\{d_1 = 1, d_2 = 1\} + P\{d_1 = -1, d_2 = 1\} \quad (42) \\ &= P\{d_2 = 1/d_1 = 1\}P\{d_1 = 1\} + \\ &\quad P\{d_2 = 1/d_1 = -1\}P\{d_1 = -1\}, \end{aligned}$$

where $P\{X\}$ denotes the probability of set X. If comparator 291 makes a wrong decision, then statistic $\Lambda_1$ or $\Lambda_2$ contains only interference noise. Hence we have $$P\{d_2 = 1/d_1 = -1, H_1\} = \frac{1}{2}. \quad (43)$$

Let $P_{e2} = P\{d_2 = -1/d_1 = 1, H_1\}$. Then $$\begin{aligned} P\{\hat{b}_{2l} = 1/b_{2l} = 1, H_1\} &= (1-P_{e1})(1-P_{e2}) + \frac{1}{2}P_{e1} \quad (44) \\ &= 1 - \left(P_{e2} + \frac{1}{2}P_{e1}\right) + P_{e1}P_{e2} \end{aligned}$$

and $$P\{\hat{b}_{2l} = -1/b_{2l} = 1, H_1\} = P_{e2} + \frac{1}{2}P_{e1} - P_{e1}P_{e2}. \quad (45)$$

Note that $P\{\hat{b}_{2l} = -1/b_{2l} = 1, H_2\} = P\{\hat{b}_{2l} = -1/b_{2l} = 1, H_1\}$. Assuming that $b_{2l}$ and $b_{2l+1}$ are independent and $P\{b_{2l} = 1\} = P\{b_{2l} = -1\} = \frac{1}{2}$, the bit error rate of the BPSK-BPP-DS-CDMA system is then given by $$P_e = P_{e2} + P_{e1}\left(\frac{1}{2} - P_{e2}\right), \quad (46)$$

thus $$P_e < P_{e2} + UP_{e1}\left(\frac{1}{2} - P_{e2}\right). \quad (47)$$

Since $P_{e2}$ is the error rate of a bipolar signaling system and $UP_{e1}/2$ is the error rate of the corresponding unipolar signaling system, we have $UP_{e1} \geq 100 P_{e2}$ for $P_{e2} < 10^{-4}$. Because $P_{e2} < 10^{-4}$ is usually required in practice, we can use $P_{e2} + UP_{e1}(\frac{1}{2} - P_{e2}) \approx UP_{e1}/2$ in the following discussion. As a result, $$P_e < \frac{1}{2} UP_{e1} = Q\left(\sqrt{\frac{2E_b}{\frac{2}{3}(J-1)PT_s + 2N_0}}\right). \quad (48)$$

The $E_b = PT$ in Eq.(48) is the energy used for one decision. However, it is the energy of $x_3(t)$, defined in Eq.(26), within 2T interval.

Comparing Eq.(48) with Eq.(23) under same bandwidth and quality comparison conditions, i.e., $T_s = T_c$ and the same bit error rate, we have the following conclusion:

If $(J-1)PT_s/3 >> N_0$, the multiple access capacity of the BPSK-BPP-DS-CDMA system is at least equal to conventional systems. However, half of the transmission energy is saved since each duty-pulse is present only in $PP_1$ or $PP_2$ and the power of each duty-pulse is equal to P.

(3) Performance Evaluations of the BPSK-QPP-DS-CDMA System of the Present Invention (K=3, M=4)

FIGS. 8A–8B show the BPSK-QPP-DS-CDMA system. The spreading-sequence signal $S_p^i(t)$ used by the system shown in FIGS. 8A–8B is also assumed to be a pseudorandom sequence signal $PN_p^i(t)$ having a period $N_{cp}$ equal to $N_{bp}$ and a chip duration of $T_{cp}$. This $PN_p^i(t)$ is the signature of the i-th user. As in the BPSK-BPP-DS-CDMA system, for purposes of comparision, the bandwidths and the amount of energy used for one decision in the conventional BPSK-DS-CDMA and BPSK-QPP-DS-CDMA systems are assumed to be the same. The same bandwidth constraint is equivalent to the condition $T_s = T_c$, where $T_s = T_{cp}/4$. Since the structure and the function of the BPSK-QPP-DS-CDMA system are similar to the BPSK-BPP-DS-CDMA system, the transmitted waveform $PN_c^i(t)$ and its possible pulse package patterns of $PN_{cn}^i(t)$ in each 3T are similarly defined and thus need not be re-described here. In FIGS. 9A–9H, we can see that the pulses are present only in $PP_1$, $PP_2$, $PP_3$, or $PP_4$. Thus we define four hypotheses $H_1$: the pulses are present in $PP_1$;

$H_2$: the pulses are present in $PP_2$;

$H_3$: the pulses are present in $PP_3$; and $H_4$: the pulses are present in $PP_4$.

By employing the analysis method used in the BPSK-BPP-DS-CDMA system, the signal-to-noise ratios at the outputs of summers 361, 362, 363, and 364 in $PP_1$, $PP_2$, $PP_3$, and $PP_4$ of the BPSK-QPP-DS-CDMA system were derived as $$SNR = \frac{2PT}{\frac{1}{3}\left[\frac{2}{3}(J-1)PT_s\right] + N_0}. \quad (49)$$

For $2(J-1)PT_s/9 >> N_0$, we have $$SNR = \frac{2PT}{\frac{1}{3}\left[\frac{2}{3}(J-1)PT_s\right]}. \quad (50)$$

Comparing Eq.(50) with Eq.(22), that is comparing the SNR of the BPSK-QPP-DS-CDMA system with the SNR of conventional BPSK-DS-CDMA systems, we find that the SNR is improved by a factor of 3.

By considering the hypotheses testing of $H_k$, k=1,2,3, and 4, as with the BPSK-BPP-DS-CDMA system, we found that the bit error rate $P_e$ of the BPSK-QPP-DS-CDMA system satisfies $$P_e < \frac{1}{2} UP_{IV} = 3Q\left(\sqrt{\frac{2E_b}{\frac{2}{3}\left[\frac{2}{3}(J-1)PT_s\right] + 2N_0}}\right). \quad (51)$$

The $E_b$ in Eq.(51) is the amount of energy used for one decision in the BPSK-QPP-DS-CDMA system. For $Q(\cdot) = 10^{-6}$, the factor 3 in $3Q(\cdot)$ of Eq.(51) is approximately equivalent to a 0.5 dB reduction in SNR. In other words, the SNR is reduced by a factor of 0.89. Comparing the argument of the Q-function in Eq.(51) with Eq.(23) under same bandwidth and quality comparison conditions, i.e., $T_s = T_c$ and same bit error rate, we have the following conclusion.

If $2(J-1)PT_s/9 >> N_0$, the multiple access capacity of the BPSK-QPP-DS-CDMA system is increased by a factor of at least $0.89 \times 3/2 = 1.335$ over conventional systems. Furthermore, two-thirds of the transmission energy is saved since each duty-pulse is present only in $PP_1$, $PP_2$, $PP_3$, or $PP_4$ and the power of each duty-pulse is equal to 4P/3.

(4) Performance Evaluation of The BPSK-MPP-DS-CDMA System of the Present Invention ($M=2^{K-1}$)

FIGS. 15A–15B show the BPSK-MPP-DS-CDMA system. The spreading-sequence signal $S_p^i(t)$ used by the system shown in FIGS. 15A–15B is assumed to be a pseudorandom sequence signal $PN_p^i(t)$ having a period $N_{cp}$ equal to $N_{bp}$ and a chip duration of $T_{cp}$. This $PN_p^i(t)$ is the signature of the i-th user. We know from analyzing the BPSK-BPP-DS-CDMA and BPSK-QPP-DS-CDMA systems that each chip $T_{cp}$ is divided into M, $M=2^{K-1}$, pulse-positions and are designated $PP_1$, $PP_2$, ..., and $PP_M$ in the M-ary system. Thus M hypotheses $H_l$, l=1, 2, ..., M, are defined. Since a positive or negative pulse can be present in any pulse-position, the transmitted waveforms $PN_c^i(t)$ consists of 2M, $2M=2^K$, possible duty-pulse package patterns, $PN_{cn}^i(t)$, n=1, 2, ..., 2M, within each KT.

Let $d_i(t)$ denote the binary data signal to be transmitted to the communication channel, and be represented as $$d_i(t) = \sum_{l=-\infty}^{\infty} b_l^i P_T(t - lT), \quad (52)$$

where $P_T(t)$ is a rectangular pulse having duration T which starts at t=0 and $b_l^i \in \{1, -1\}$ for each l. This $d_i(t)$ is converted by K-bit serial-to-parallel converter 910 into K parallel data sequences as follows:

$$d_{im}(t) = \sum_{l=-\infty}^{\infty} b_{Kl+m-1} P_{KT}(t - KlT), \quad (53)$$

where m=1, 2, ..., K, and $P_{KT}(t)$ has duration KT. We thus form a sequence of vectors $B_K = (b_{Kl}, b_{Kl+1}, \ldots b_{Kl+K-1})$ with the duration of the vector $B_K$ equal to KT, where the superscript i of $b_l^i$ has been omitted. Since $b_l \in \{1, -1\}$ every l, there are 2M possible vector patterns within every KT duration.

Just as with the BPSK-BPP-DS-CDMA and BPSK-QPP-DS-CDMA systems, one to one assignment between $PN_{cn}^i(t)$ and the $2M$ possible $B_K$ vectors are made and the transmitted signal $x_3(t)$ can then be represented as $$x_3(t) = \sqrt{\frac{2MP}{K}} \; PN_c^i(t)\sin(\omega_0 t). \tag{54}$$

For the case where J users are present in the channel, the received signal can be represented as $$y(t) = \sum_{j=1}^{J} \sqrt{\frac{2MP}{K}} \; PN_c^j(t-\tau_j)\sin[\omega_0(t-\tau_j)+\phi_j] + n(t), \tag{55}$$

where $PN_c^j(t)$ is the transmitted waveform of the j-th user. Since only relative time delays and phase angles need be considered, $\phi_i$ and $\tau_i$ of the i-th transmitter can be assumed to be zero, i.e., $\phi_i=0$ and $\tau_i=0$.

Then, assuming coherent demodulation, the performance of the BPSK-MPP-DS-CDMA system is evaluated in below.

Just as with the BPSK-BPP-DS-CDMA system, if we consider $PN_p^i(t)$ as a random sequence signal, the psd of $PN_c^i(t)$ can then be derived as $$S_i(f) = \frac{T_s}{M} \text{sinc}^2(\pi f T_s). \tag{56}$$

If $T_s=T_c$, the bandwidths of the BPSK-DS-CDMA and BPSK-MPP-DS-CDMA system are the same.

Then by employing the method used in the analysis of BPSK-BPP-DS-CDMA system, the two-sided psd around $f=0$ of the CCN within each $PP_l$, $l=1,2,\ldots,M$, can be considered as a constant with the value given by $$\frac{N_{JP}}{2} = \frac{1}{K}\left[\frac{1}{3}(J-1)PT_s\right]. \tag{57}$$

Notice that $N_{JP}/2$ is $1/K$ of the $N_J/2$ defined in Eq.(20). In other words, the psd of CCN in the BPSK-MPP-DS-CDMA system is $1/K$ of the psd of CCN in the conventional BPSK-DS-CDMA system.

4.1 Signal-to-noise Ratio of the BPSK-MPP-DS-CDMA System

From Eq.(57), the signal-to-noise ratios at the outputs of summers of array of summers 960 in every pulse position $PP_l$, $l=1, 2, \ldots, M$, of the BPSK-MPP-DS-CDMA system were derived and given by $$SNR = \frac{2PT}{\frac{1}{K}\left[\frac{2}{3}(J-1)PT_s\right] + N_0}. \tag{58}$$

For $2(J-1)PT_s/3K \gg N_0$, we have $$SNR = \frac{2PT}{\frac{1}{K}\left[\frac{2}{3}(J-1)PT_s\right]}. \tag{59}$$

Comparing Eq.(59) with Eq.(22), that is, comparing the SNR of the BPSK-MPP-DS-CDMA system with the SNR of conventional BPSK-DS-CDMA systems, we find the SNR has been improved by a factor of K.

4.2 Bit Error Rate of the BPSK-MPP-DS-CDMA System

Let $P(|\Lambda_2|<|\Lambda_1|, \ldots, |\Lambda_M|<|\Lambda_1|/|\Lambda_1|,H_1)$ denote the joint probability that $|\Lambda_2|, \ldots, |\Lambda_M|$ are all less than $|\Lambda_1|$ assuming $|\Lambda_1|$ and $H_1$. Then the probability of a correct decision by magnitude comparator 980 under hypothesis $H_1$ is $$P_{c/H_1} = \int_0^\infty P\{|\Lambda_2|<|\Lambda_1|, \ldots, \tag{60}$$

$$|\Lambda_M|<|\Lambda_1|/|\Lambda_1|, H_1\} f_{|\Lambda_1|/H_1}(\lambda_1/H_1)d\lambda_1.$$

Since the a priori probabilities $P(H_k)$, $k=1, 2, \ldots, M$, are equal, the probability of a correct decision $P_c$ by magnitude comparator 980 is equal to $P_{c/H_1}$. Let $P_{IC}$ denote the probability of a correct decision of magnitude comparator 980 under the assumption that $\Lambda_1, \Lambda_2, \ldots$ and $\Lambda_M$ are independent. Then $$P_{IC} \geq \left\{1 - 2Q\left(\frac{\sqrt{\frac{MP}{K}}}{\sqrt{2}\;\sigma_1}\right)\right\}^{(M-1)} \tag{61}$$

On the other hand, let $P_{IW}$ denote the corresponding probability of a wrong decision by magnitude comparator 980. Then, $$P_{IW} \leq (M-1)\cdot 2Q(A) - \frac{M(M-1)}{2!}\cdot(2Q(A))^2 \ldots +(2Q(A))^{M-1}, \tag{62}$$

where $A=\sqrt{MP/K}/\sqrt{2}\sigma_l$. In practice, $Q(A)<10^{-4}$. Thus we have $$P_{IW} \leq (M-1)\cdot 2Q(A). \tag{63}$$

Let $$UP_{IW} = 2(M-1)Q(A). \tag{64}$$

As with the BPSK-BPP-DS-CDMA and BPSK-QPP-DS-CDMA systems, the bit error rate of the BPSK-MPP-DS-CDMA system satisfies $$P_e < \frac{1}{2}\; UP_{IW} = (M-1)Q\left(\sqrt{\frac{2E_b}{\frac{2}{K}\left[\frac{2}{3}(J-1)PT_s\right]+2N_0}}\right). \tag{65}$$

The $E_b$ in Eq.(65) is the energy used for one decision in the BPSK-MPP-DS-CDMA system. For $Q(\cdot)=10^{-6}$, the factor $(M-1)$ is approximately equivalent to a $R_E$ dB reduction in SNR. Then $0^{-0.1R_E}$ is the corresponding SNR reduction factor. The related parameters for $K=3, 4,$ and $5$ are given in Table C1:

TABLE C1

| K | M−1 | $R_E$ | $10^{-0.1R_E}$ | F |
|---|---|---|---|---|
| 3 | 3 | 0.5 | 0.89 | 1.335 |
| 4 | 7 | 0.8 | 0.83 | 1.66 |
| 5 | 15 | 1.8 | 0.66 | 1.65 |

Comparing Eq.(65) with Eq.(23) under same bandwidth and same bit error rate comparison conditions, we arrive at the following conclusion:

For $Q(\cdot)=10^{-6}$ and for the multiple access capacity is not limited by the number $N_u$ of available sequence signals in the pseudorandom sequence signal set $\{PN_p(t)\}$ used in the BPSK-MPP-DS-CDMA system, i.e., the number of users is less than $N_u$, if $2(J-1)PT_s/3K \gg N_0$, the system of the present invention improves the multiple access capacity by a factor of at least $F=K10^{-0.1R_E}/2$ over conventional systems. Some specific results are also given in Table C1. Conversely, when the number of users reaches $N_u$, the improvement in signal-to-noise ratio provides no further increase in multiple access capacity, but does reduce the bit error rate. Furthermore, (K−1)/K of the transmission energy is saved since each duty-pulse is present only in one of M pulse-positions and the power of each transmitted duty pulse is MP/K.

The present invention has been described hitherto with exemplary preferred embodiments. However, the scope of the present invention need not be limited to these disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A method of transmitting and receiving a serial data bit stream in a direct-sequence code division multiple access communication system, comprising the steps of:

(a) converting each group of K consecutive bits of the serial data bit stream into K parallel bits with a bit duration equal to K×T, where K is a preselected positive integer larger than 1, "×" is a multiplication indicator, and T is the time duration of a bit in the serial data bit stream, and thus forming a K-bit vector from the K parallel bits such that serial K-bit vectors converted from serial groups of K consecutive bits form a sequence of K-bit vectors with every K-bit vector having said bit duration of K×T;

(b) selecting a positive integer $N_{bp}$ and dividing each said bit duration of K×T into $N_{bp}$ intervals with the time duration of each interval equal to $T_{cp}$, $T_{cp}$=K×T/$N_{bp}$, where "/" is a division indicator;

(c) selecting a spreading-sequence signal $S_p^i(t)$ which has a sequence period of $N_{cp}$ and a chip duration equal to said $T_{cp}$, where $N_{cp}$ is a positive integer;

(d) dividing each said chip duration of $T_{cp}$ into M, M=$2^{K-1}$, pulse-positions, each pulse-position having a time duration of $T_s$, $T_s$=$T_{cp}$/M;

(e) defining a mapping table by which each K-bit vector formed in step (a) is converted during each said bit duration of K×T into a package of $N_{bp}$ duty-pulses, with each duty-pulse of the duty-pulse package appearing at a pulse-position which is one of the M pulse-positions in each $T_{cp}$ and with a preselected pulse polarity, the duty-pulse packages and the duty-pulses in each duty-pulse package being generated sequentially to form a duty-pulse train;

(f) modulating the duty-pulse train formed in step (e) with said spreading-sequence signal $S_p^i(t)$ into a pulse-position modulated spreading-sequence signal;

(g) modulating the pulse-position modulated spreading-sequence signal formed in step (f) with a carrier signal into a carrier-modulated signal and transmitting the carrier-modulated signal to a channel of the communication system;

(h) receiving as a received carrier-modulated signal the carrier-modulated signal which is transmitted via a communication channel from the transmission portion of the communication system;

(i) recovering the $N_{bp}$ duty-pulses in each duty-pulse package formed in step (e) from the received carrier-modulated signal by demodulating the received carrier-modulated signal synchronously with a locally generated carrier signal and a spreading-sequence signal;

(j) determining pulse-position and pulse polarity of the $N_{bp}$ duty-pulses in each duty-pulse package received, and determining by reference to the mapping table defined in step (e) the K-bit vector represented by each duty-pulse package received; and (k) converting each K-bit vector determined in step (j) into corresponding K consecutive bits of a serial data bit stream.

2. A method of transmitting a serial data bit stream from a data source to a communication channel in a direct-sequence code division multiple access communication system, comprising the steps of:

(a) converting each group of K consecutive bits of the serial data bit stream into K parallel bits with a bit duration equal to K×T, where K is a preselected positive integer larger than 1, "×" is a multiplication indicator, and T is the time duration of a bit in the serial data bit stream, and thus forming a K-bit vector from the K parallel bits such that serial K-bit vectors converted from serial groups of K consecutive bits form a sequence of K-bit vectors with every K-bit vector having said bit duration of K×T;

(b) selecting a positive integer $N_{bp}$ and dividing each said bit duration of K×T into $N_{bp}$ intervals with the time duration of each interval equal to $T_{cp}$, $T_{cp}$=K×T/$N_{bp}$, where "/" is a division indicator;

(c) selecting a spreading-sequence signal $S_p^i(t)$ which has a sequence period of $N_{cp}$ and a chip duration equal to said $T_{cp}$, where $N_{cp}$ is a positive integer;

(d) dividing each said chip duration of $T_{cp}$ into M, M=$2^{K-1}$, pulse-positions, each pulse-position having a time duration of $T_s$, $T_s$=$T_{cp}$/M;

(e) defining a mapping table by which each K-bit vector formed in step (a) is converted during each said bit duration of K×T into a package of $N_{bp}$ duty-pulses, with each duty-pulse in the duty-pulse package appearing at a pulse-position which is one of the M pulse-positions in each $T_{cp}$ and with a preselected pulse polarity, the duty-pulse packages and the duty-pulses in each duty-pulse package being generated sequentially to form a duty-pulse train;

(f) modulating the duty-pulse train formed in step (e) with said spreading-sequence signal $S_p^i(t)$ into a pulse-position modulated spreading-sequence signal;

(g) modulating the pulse-position modulated spreading-sequence signal formed in step (f) with a carrier signal into a carrier-modulated signal and transmitting the carrier-modulated signal to a channel of the communication system.

3. A method of recovering a serial data bit stream from a carrier-modulated signal received in a direct-sequence code division multiple access communication system, comprising the steps of:

(a) receiving as a received carrier-modulated signal the carrier-modulated signal transmitted via a communication channel from the transmission portion of the communication system;

(b) demodulating the received carrier-modulated signal synchronously with a locally generated carrier signal and a spreading-sequence signal which has a chip duration equal to $T_{cp}$ into a duty-pulse train that has a duty-pulse present in one of M pulse-positions within each said chip duration $T_{cp}$, where M=$2^{K-1}$ and K is a positive integer defined in the transmission portion of the communication system;

(c) considering each package of $N_{bp}$ consecutive bits in said duty-pulse train as a duty-pulse package and determining pulse-position and pulse polarity of the $N_{bp}$ duty-pulses of each duty-pulse package received, where $N_{bp}$ is a positive integer defined in the transmission portion of the communication system, then determining by reference to the mapping table defined in the transmission portion of the communication system the K-bit vector represented by each duty-pulse package received; and (d) converting each K-bit vector determined in step (c) into corresponding K consecutive bits of a serial data bit stream.

4. The method of claim 1, wherein the spreading-sequence signal is a pseudorandom sequence signal which generates a sequence of nearly random bits with bit duration equal to $T_{cp}$, and having a sequence period of $N_{cp}$, $N_{cp}$ is a positive integer.

5. The method of claim 1, wherein the spreading-sequence signal is a pseudorandom sequence signal having a chip duration of $T_{cp}$ and a sequence period $N_{cp}$ equal to $N_{bp}$.

6. The method of claim 1, wherein the spreading-sequence signal is a Gold code signal which has a chip duration equal to $T_{cp}$, and a code length equal to $N_{cp}$, $N_{cp}$ is a positive integer.

7. The method of claim 1, wherein the spreading-sequence signal is a Gold code signal having a chip duration of $T_{cp}$ and a code length $N_{cp}$ equal to $N_{bp}$.

8. The method of claim 1, wherein the spreading-sequence signal is an orthogonal code signal which has a chip duration equal to $T_{cp}$ and a code length $N_{cp}$ equal to $N_{bp}$.

9. The method of claim 1, wherein the carrier signal is a sinusoidal signal.

10. An apparatus for transmitting a serial data bit stream from a data source to a communication channel in a direct-sequence code division multiple access communication system, comprising:

a serial-to-parallel converter for converting the serial data bit stream into K parallel bit streams with a bit duration equal to K×T, where K is a preselected positive integer larger than 1 and T is the bit duration of the serial data bit stream, and for sending out a sequence of K-bit vectors formed from said K parallel bit streams;

a pulse-position modulator for modulating a spreading-sequence signal with said sequence of K-bit vectors into a pulse-position modulated spreading-sequence signal such that each chip of said pulse-position modulated spreading-sequence signal has M pulse-positions, where $M=2^{K-1}$, in each chip duration and has the pulse-position of duty-pulses within a duty-pulse package in said pulse-position modulated spreading-sequence signal determined by a K-bit vector of said sequence of K-bit vectors; and a carrier modulator for modulating said pulse-position modulated spreading-sequence signal by a carrier signal into a carrier-modulated signal and for transmitting the carrier-modulated signal to a channel of the communication system.

11. An apparatus for recovering a serial data bit stream from a received carrier-modulated signal in a direct-sequence code devision multiple access communication system, comprising:

a carrier demodulator for demodulating the received carrier-modulated signal with a locally generated carrier signal synchronously into a pulse-position modulated spreading-sequence signal;

a pulse demodulator connected to said carrier demodulator for demodulating said pulse-position modulated spreading-sequence signal with a locally generated spreading-sequence signal synchronously into a duty-pulse train as an output signal of said pulse demodulator;

an array of M switches connected to the output of said pulse demodulator and respectively activated by M control-pulse trains, where $M=2^{K-1}$ and K is an integer larger than 1 and is defined in the transmission portion of the communication system, such that the duty-pulse train output from said pulse demodulator is demultiplexed into M pulse trains, which have the duration of each pulse in the M pulse trains equal to the duration of duty-pulse of said duty-pulse train, as M output signals of said array of M switches;

an array of M matched filters connected respectively to said array of M switches to process the signals output from said array of M switches;

an array of M samplers connected respectively to said array of M matched filters for sampling the signals output from said array of M matched filters periodically with periods equal to $T_{cp}$, where $T_{cp}$ is the chip duration of said spreading-sequence signal;

an array of M summers connected respectively to said array of M samplers to sum the sampling data output from each sampler of said array of M samplers, respectively, and thus to form M signals representative of M statistics periodically with periods equal to K×T, where T is the bit duration of said serial data bit stream;

an array of M absolute-value generators connected respectively to said array of M summers for generating M signals representative of the absolute values of said M statistics;

a magnitude comparator for receiving and comparing the signals representative of the absolute values of said M statistics output from said array of M absolute-value generators to find the statistic that has the largest absolute value among said M statistics and sending out a decision-bit vector as an output of said magnitude comparator to indicate the statistic that has the largest absolute value among said M statistics;

a switch circuit with M inputs connected respectively to said array of M summers and activated by said decision-bit vector to allow only the signal representative of the statistic that has the largest absolute value among said M statistics to pass therethrough as an output signal of said switch circuit;

a comparator for receiving the signal output from said switch circuit and for comparing the signal with a reference voltage of zero volt to generate a polarity decision bit as an output signal of said comparator;

a logic circuit for transforming said decision-bit vector and said polarity decision bit into a deciphered K-bit vector including K data bits in parallel; and a parallel-to-serial converter connected to said logic circuit for converting a sequence of K-bit vectors into a serial data bit stream.

12. An apparatus for recovering a serial data bit stream from a received carrier-modulated signal in a direct-sequence code division multiple access communication system, comprising:

a carrier demodulator for demodulating the received carrier-modulated signals with a locally generated carrier signal synchronously into a pulse-position modulated spreading-sequence signal;

a pulse demodulator connected to said carrier demodulator for demodulating said pulse-position modulated spreading-sequence signal with a locally generated spreading-sequence signal synchronously into a duty-pulse train as an output of said pulse demodulator;

a pair of switches connected to the output of said pulse demodulator and respectively activated by two control-pulse trains such that the duty-pulse train output from said pulse demodulator is demultiplexed into two pulse trains, which have the duration of each pulse in the two pulse trains equal to the duration of duty-pulse of said duty-pulse train, as output signals of said pair of switches;

a pair of matched filters connected respectively to said pair of switches to process the signals output from said pair of switches;

a pair of samplers connected respectively to said pair of matched filters for sampling the signals output from said pair of matched filters periodically with periods equal to $2T_s$, where $T_s = T_{cp}/M$, $T_{cp}$ is the chip duration of said spreading-sequence signal, $M=2^{K-1}$, and K is an integer larger 2 and is defined in the transmission portion of the communication system;

a first array of M/2 switches connected to the first sampler of said pair of samplers and respectively activated by M/2 periodic control-pulse trains such that the input sampling data from said first sampler are demultiplexed into M/2 parallel sampling data periodically with a period of $T_{cp}$;

a second array of M/2 switches connected to the second sampler of said pair of samplers and respectively activated by M/2 periodic control-pulse trains such that the input sampling data from said second sampler are demultiplexed into M/2 parallel sampling data periodically also with a period of $T_{cp}$;

an array of M summers connected to said first array of M/2 switches and said second array of M/2 switches, respectively, to sum the data output from each switch of said first array of M/2 switches and said second array of M/2 switches and thus to generate M signals representative of M statistics periodically with periods equal to K×T, where T is the bit duration of said serial data bit stream;

an array of M absolute-value generators connected respectively to said array of M summers for generating M signals representative of the absolute values of said M statistics;

a magnitude comparator for receiving and comparing the signals representative of the absolute values of said M statistics output from said array of M absolute-value generators to find the statistic that has the largest absolute value among said M statistics and sending out a decision-bit vector as an output of said magnitude comparator to indicate the statistic that has the largest absolute value among said M statistics;

a switch circuit with M inputs connected respectively to said array of M summers and activated by said decision-bit vector to allow only the signal representative of the statistic that has the largest absolute value among said M statistics to pass therethrough as an output signal of said switch circuit;

a comparator for receiving the signal output from said switch circuit and for comparing the signal with a reference voltage of zero volt to generate a polarity decision bit as an output signal of said comparator;

a logic circuit for transforming said decision-bit vector and said polarity decision bit into a deciphered K-bit vector including K data bits in parallel; and a parallel-to-serial converter connected to said logic circuit for converting a sequence of K-bit vectors into a serial data bit stream.

13. An apparatus for recovering a serial data bit stream from a received carrier-modulated signal in a direct-sequence code division multiple access communication system, comprising:

a carrier demodulator for demodulating the received carrier-modulated signal with a locally generated carrier signal synchronously into a pulse-position modulated spreading-sequence signal;

a pulse demodulator connected to said carrier demodulator for demodulating said pulse-position modulated spreading-sequence signal with a locally generated spreading-sequence signal synchronously into a duty-pulse train as an output signal of said pulse demodulator;

an array of M switches connected to the output of said pulse demodulator and respectively activated by M control-pulse trains, where $M=2^{K-1}$ and K is an integer larger than 1 and is defined in the transmission portion of the communication system, such that the duty-pulse train output from said pulse demodulator is demultiplexed into M pulse trains, which have the duration of each pulse in the M pulse trains equal to the duration of duty-pulse of said duty-pulse train, as M output signals of said array of M switches;

an array of M matched filters which are integrate-and-dump circuits with integration intervals from 0 to K×T, where T is the bit duration of said serial data bit stream, being connected to said array of M switches, respectively, to process the signals output from said array of M switches;

an array of M samplers connected respectively to said array of M matched filters for sampling the signals output from said array of M matched filters and for sending out the M sampling data representative of M statistics periodically with periods equal to K×T;

an array of M absolute-value generators connected respectively to said array of M samplers for generating M signals representative of the absolute values of said M statistics;

a magnitude comparator for receiving and comparing the signals representative of the absolute values of said M statistics output from said array of M absolute-value generators to find the statistic that has the largest absolute value among said M statistics and sending out a decision-bit vector as an output of said magnitude comparator to indicate the statistic that has the largest absolute value among said M statistics;

a switch circuit with M inputs connected respectively to said array of M samplers and activated by said decision-bit vector to allow only the signal representative of the statistic which has the largest absolute value among said M statistics to pass therethrough as an output signal of the switch circuit;

a comparator for receiving the signal output from said switch circuit and for comparing the signal with a reference voltage of zero volt to generate a polarity decision bit as an output signal of said comparator;

a logic circuit for transforming said decision-bit vector and said polarity decision bit into a deciphered K-bit vector including K data bits in parallel; and a parallel-to-serial converter connected to said logic circuit for converting a sequence of K-bit vectors into a serial data bit stream.

14. An apparatus for transmitting a serial data bit stream from a data source to a communication channel in a direct-sequence code division multiple access communication system, comprising:

means for converting the serial data bit stream into K parallel bit streams with a bit duration equal to K×T so that a sequence of K-bit vectors is formed from the K parallel bit streams, where K is a preselected positive integer larger than 1 and T is the bit duration of the serial data bit stream;

means for modulating a spreading-sequence signal with said sequence of K-bit vectors into a pulse-position modulated spreading-sequence signal such that each chip of said pulse-position modulated spreading-sequence signal has M pulse-positions, where $M=2^{K-1}$, in each chip duration and has the pulse-position of duty-pulses within a duty-pulse package in said pulse-position modulated spreading-sequence signal determined by a K-bit vector of said sequence of K-bit vectors; and means for modulating said pulse-position modulated spreading-sequence signal with a carrier signal into a carrier-modulated signal and for transmitting the carrier-modulated signal to a channel of the communication system.

15. An apparatus for recovering a serial data bit stream from a received carrier-modulated signal in a direct-sequence code division multiple access communication system, comprising:

means for demodulating the received carrier-modulated signal with a locally generated carrier signal synchronously into a pulse-position modulated spreading-sequence signal;

means for demodulating said pulse-position modulated spreading-sequence signal with a locally generated spreading-sequence signal synchronously into a duty-pulse train;

means, connected to the output of said pulse-position modulated spreading-sequence signal demodulating means, for demultiplexing said duty-pulse train into M parallel pulse trains, which have the duration of each pulse in the M parallel pulse trains equal to the duration of duty-pulse of said duty-pulse train, where $M=2^{K-1}$ and K is an integer larger than 1 and was defined in the transmission portion of the communication system;

means, connected respectively to said demultiplexing means, for matched filtering respectively the M parallel pulse trains output from said demultiplexing means;

means, connected respectively to said matched filtering means, for sampling the M output signals of said matched filtering means periodically with periods equal to $T_{cp}$, where $T_{cp}$ is the chip duration of said spreading-sequence signal;

means, connected respectively to said sampling means, for summing the data output from each of said sampling means and thus to form M signals representative of M statistics periodically with periods equal to K×T, where T is the bit duration of said serial data bit stream;

means, connected respectively to said summing means, for generating signals representativs of absolute values of said M statistics;

means, connected respectively to said absolute-value generating means, for receiving and comparing the signals representative of the absolute values with one another to find the statistic that has the largest absolute value among said M statistics, so that providing a decision-bit vector as an out of the receiving and comparing means to indicate the statistic that has the largest absolute value among said M statistics;

means, connected respectively to said summing means and activated by said decision-bit vector, for controlling only the signal representative of the statistic that has the largest absolute value among said M statistics from said summing means to pass therethrough as an output signal of controlling means;

means, connected to said controlling means, for receiving the signal output from said controlling means and for comparing the signal with a reference voltage to generate a polarity decision bit;

means for transforming said decision-bit vector and said polarity decision bit into a deciphered K-bit vector including K data bits in parallel; and means, connected to said transforming means, for converting a sequence of K-bit vectors into a serial data bit stream.

16. An apparatus for recovering a serial data bit stream from a received carrier-modulated signal in a direct-sequence code-division-multiple-access communication system, comprising:

means for demodulating the received carrier-modulated signal with a locally generated carrier signal synchronously into a pulse-position modulated spreading-sequence signal;

means for demodulating said pulse-position modulated spreading-sequence signal with a locally generated spreading-sequence signal synchronously into a duty-pulse train;

prior demultiplexing means, connected to the output of said pulse-position modulated spreading-sequence signal demodulating means, for demultiplexing said duty-pulse train into two parallel pulse trains, which have the duration of each pulse in the two parallel pulse trains equal to the duration of duty-pulse of said duty-pulse train, as two output signals of said prior demultiplexing means;

means, connected respectively to said prior demultiplexing means, for matched filtering respectively said two output signals of said prior demultiplexing means;

first sampling means, connected to the first matched filtering means of said two matched filtering means, for sampling the output signal of said first matched filtering means periodically with a period of $2T_s$, where $T_s=T_{cp}/M$, $T_{cp}$ is the chip duration of said spreading-sequence signal, $M=2^{K-1}$, and K is an integer larger 2 and is defined in the transmission portion of the communication system;

second sampling means, connected to the second matched filtering means of said two matched filtering means, for sampling the output signal of said second matched filtering means periodically also with a period of $2T_s$;

first demultiplexing means, connected to said first sampling means, for demultiplexing the sampling data into M/2 parallel data periodically with a period of $T_{cp}$;

second demultiplexing means, connected to said second sampling means, for demultiplexing the sampling data into M/2 parallel data periodically with a period of $T_{cp}$;

means, connected respectively to said first and second demultiplexing means, for summing the data output from each output of said first and second demultiplexing means to form M signals representative of M statistics periodically with periods equal to K×T, where T is the bit duration of said serial data bit stream;

means, connected respectively to said summing means, for generating signals representativs of absolute values of said M statistics;

means, connected respectively to said absolute-value generating means, for receiving and comparing the signals representative of the absolute values with one another to find the statistic that has the largest absolute value among said M statistics, so that providing a decision-bit vector as an out of the receiving and comparing means to indicate the statistic that has the largest absolute value among said M statistics;

means, connected respectively to said summing means and activated by said decision-bit vector, for controlling only the signal representative of the statistic that has the largest absolute value among said M statistics from said summing means to pass therethrough as a controlling means output signal;

means, connected to said controlling means, for receiving the signal output from said controlling means and for comparing the signal with a reference voltage of zero volt to generate a polarity decision bit;

means for transforming said decision-bit vector and said polarity decision bit into a deciphered K-bit vector including K data bits in parallel; and means, connected to said transforming means, for converting a sequence of K-bit vectors into a serial data bit stream.

17. An apparatus for recovering a serial data bit stream from a received carrier-modulated signal in a direct-sequence code division multiple access communication system, comprising:

means for demodulating the received carrier-modulated signal with a locally generated carrier signal synchronously into a pulse-position modulated spreading-sequence signal;

means for demodulating said pulse-position modulated spreading-sequence signal with a locally generated spreading-sequence signal synchronously into a duty-pulse train;

means, connected to the output of said pulse-position modulated spreading-sequence signal demodulating means, for demultiplexing said duty-pulse trains into M pulse trains, which have the duration of each pulse in the M pulse trains equal to the duration of duty-pulse of said duty-pulse train, where $M=2^{K-1}$ and K is an integer larger than 1 and was defined in the transmission portion of the communication system;

means, connected respectively to said demultiplexing means, for matched filtering respectively by integrating from 0 to K×T the M parallel pulse signals output from said demultiplexing means, where T is the bit duration of said serial data bit stream;

means, connected respectively to said matched filtering means, for sampling the M output signals of said matched filtering means periodically with periods equal to K×T and thus providing M signals representative of M statistics;

means, connected respectively to said sampling means, for generating M signals representative of absolute values of said M statistics;

means, connected respectively to said absolute-value generating means, for receiving and comparing the M signals representative of the absolute values with one another to find the statistic that has the largest absolute value among said M statistics, so that providing a decision-bit vector as an out signal of the receiving and comparing means to indicate the statistic that has the largest absolute value among said M statistics;

means, connected respectively to said sampling means and activated by said decision-bit vector, for controlling only the signal representative of the statistic that has the largest absolute value among said M statistics from said sampling means to pass therethrough as an output signal of controlling means;

means, connected to said controlling means, for receiving the signal output from said controlling means and for comparing the signal with a reference voltage to generate a polarity decision bit;

means for transforming said decision-bit vector and said polarity decision bit into a deciphered K-bit vector including K data bits in parallel; and means, connected to said transforming means, for converting a sequence of K-bit vectors into a serial data bit stream.

18. The method of claim 1, 2, or 3, wherein K equals 2.
19. The method of claim 1, 2, or 3, wherein K equals 3.
20. The method of claim 1, 2, or 3, wherein K equals 4.
21. The apparatus of claim 10, 11, 13, 14, 15, or 17, wherein K equals 2.
22. The apparatus of claim 10, 11, 12, 13, 14, 15, 16, or 17, wherein K equals 3.
23. The apparatus of claim 10, 11, 12, 13, 14, 15, 16, or 17, wherein K equals 4.

* * * * *